United States Patent
Bocian et al.

(10) Patent No.: US 7,348,206 B2
(45) Date of Patent: Mar. 25, 2008

(54) FORMATION OF SELF-ASSEMBLED MONOLAYERS OF REDOX SAMS ON SILICON FOR MOLECULAR MEMORY APPLICATIONS

(75) Inventors: David F. Bocian, Riverside, CA (US); Werner G. Kuhr, Oak Hills, CA (US); Jonathan S. Lindsey, Raleigh, NC (US); Rajeeve Balkrishna Dabke, Columbus, OH (US); Zhiming Liu, Riverside, CA (US)

(73) Assignees: The Regents of the University of California, Oakland, CA (US); The North Carolina State University, Raleigh, NC (US)

( * ) Notice: Subject to any disclaimer, the term of this patent is extended or adjusted under 35 U.S.C. 154(b) by 1279 days.

(21) Appl. No.: 10/040,059

(22) Filed: Oct. 26, 2001

(65) Prior Publication Data

US 2003/0081463 A1 May 1, 2003

(51) Int. Cl.
*H01L 51/40* (2006.01)
(52) U.S. Cl. ...................................... 438/99
(58) Field of Classification Search ................. 438/96, 438/99; 556/449, 400
See application file for complete search history.

(56) References Cited

U.S. PATENT DOCUMENTS

| | | | |
|---|---|---|---|
| 3,637,581 A | 1/1972 | Horiguchi et al. | |
| 4,618,509 A | 10/1986 | Bulkowski | |
| 4,702,965 A * | 10/1987 | Fang | 428/457 |
| 4,772,486 A * | 9/1988 | Ishihara et al. | 427/561 |
| 5,089,872 A | 2/1992 | Ozturk et al. | |
| 5,173,443 A | 12/1992 | Biricik et al. | |
| 5,280,183 A | 1/1994 | Batzel et al. | |
| 5,281,552 A | 1/1994 | King et al. | |
| 5,294,285 A | 3/1994 | Kanai et al. | |
| 5,463,014 A | 10/1995 | Epstein et al. | |
| 5,475,075 A | 12/1995 | Brant et al. | |
| 5,547,774 A | 8/1996 | Gimzewski et al. | |
| 5,814,420 A | 9/1998 | Chu | |
| 5,834,100 A * | 11/1998 | Marks et al. | 428/209 |
| 5,844,055 A | 12/1998 | Brandt et al. | |

(Continued)

FOREIGN PATENT DOCUMENTS

WO WO 01/03126 1/2001

OTHER PUBLICATIONS

"Ferrocene—Synthesis", Jun. 1996, University of Oxford Web Page, http://www.ncl.ox.ac.uk/mom/ferrocene/synthesis.html.

(Continued)

*Primary Examiner*—Yvonne Eyler
*Assistant Examiner*—Jennifer Y Cho
(74) *Attorney, Agent, or Firm*—Beyer Weaver LLP; Tom Hunter

(57) ABSTRACT

This invention provides a new method of forming a self-assembling monolayer (SAM) of alcohol-terminated or thiol-terminated organic molecules (e.g. ferrocenes, porphyrins, etc.) on a silicon or other group IV element surface. The assembly is based on the formation of an E-O— or an E-S— bond where E is the group IV element (e.g. Si, Ge, etc.). The procedure has been successfully used on both P- and n-type group IV element surfaces. The assemblies are stable under ambient conditions and can be exposed to repeated electrochemical cycling.

23 Claims, 7 Drawing Sheets

U.S. PATENT DOCUMENTS

| | | | |
|---|---|---|---|
| 6,013,170 | A | 1/2000 | Meade |
| 6,031,756 | A | 2/2000 | Gimzewski et al. |
| 6,128,214 | A | 10/2000 | Kuekes et al. |
| 6,136,678 | A | 10/2000 | Adetutu et al. |
| 6,208,553 | B1 | 3/2001 | Gryko et al. |
| 6,212,093 | B1 | 4/2001 | Lindsey |
| 6,246,505 | B1 | 6/2001 | Teowee et al. |
| 6,272,038 | B1 | 8/2001 | Clausen et al. |
| 6,324,091 | B1 | 11/2001 | Gryko et al. |
| 6,381,169 | B1 | 4/2002 | Bocian et al. |
| 6,451,942 | B1 | 9/2002 | Li et al. |
| 2002/0197806 | A1 | 12/2002 | Furukawa et al. |

OTHER PUBLICATIONS

Buchler and Ng (2000) In *The Porphyrin Handbook*, vol. 3, pp. 245-294, Eds. K. M. Kadish, K. M. Smith, R. Guilard, Academic Press, San Diego, CA.

Chabach et al. (1996) "Mixed-Metal Triple-Decker Sandwich Complexes with the Porphyrin/Phthalocynine/Porphyrin Ligand System" *Angew. Chem. Int. Ed. Engl.*, 35: 898.

Cotton et al (1976) Basic Inorganic Chemistry, pp. 125, 497, 518.

Duchowski et al. (1990) Spectroscopic Characerization of Triple Decker Lanthanide Porphyrin Sandwich Complexes. Effects of Strong $\pi$ $\pi$ Interactions in Extended Assemblies J Am. Chem. Soc. 112: 8807-8811.

Gorman (1997) "Encapsulated Electroactive Molecules" Adv. Mater. 9(14) 1117-1119.

Gorman (1999) "Molecular Structure-Property Relationships for Electron-Transfer Rate Attenuation in Redox-Active Core Dendrimers" J. Am. Chem. Soc. 121: 9958-9966.

Gross (2001) "Investigation of Rational Synthesis of Heteroleptic Porphyrinic Lanthanide (Europium, Cerium) Triple-Decker Sandwich Complexes" Inorg. Chem. 40: 4762-4774.

Gryko (2000) "Synthesis of Thiol-Derivatized Ferrocene-Porphrins for Studies of Multibit Information Storage" J. Org. Chem. 65: 7356-7362.

Gryko (2001) "Studies Related to the Design and Synthesis of a Molecular Octal Counter" J. Mater. Chem. 11: 1162-1180.

Jiang et al. (1998) "Heteroleptic Triple-Decker (Phthalocyaninato)-Porphyrinato) Europium (III) Complexes: Synthesis and Electrochemical Study" Inorganica Chimica Acta 268: 49-53.

Li et al. (2000) "Synthesis of Thiol-Derivatized Europium Porphyrinic Triple-Decker Sandwich Complexes for Multibit Molecular Information Storage" J. Org. Chem. 65: 7379-7390.

Ruben et al. (2000) "Multilevel Molecular Electronic Species: Electrochemical Reduction of a [2×2] Co4 Grid Type Complex by 11 Electrons in 10 Reversible Steps" Angew. Chem. Int. Ed. 39(22) 4139-4142.

Sommerauer et al. (1996) "Separation of 1(3), 9(10), 16(17), 23(24)-Tetrasubstituted Phthalcyanines with Newly Developed HPLC Phases" J. Am Chem. Soc. 118: 10085-10093.

Wong et al. (1974) "Lanthanide Porphyrin Complexes, A Potential New Class of Nuclear Magnetic Resonance Dipolar Probe" J. Am. Chem. Soc. 96(22) 7149-7150.

Bansal and Lewis (1998) *J. Phys. Chem.* 102: 1067-1070.

Bateman et al. (1998) *Angew. Chem. Int. Ed.*, 37: 2683-2685.

Bourkherroub and Wayner (1999) *J. Am. Chem. Soc.* 121: 11513-11515.

Buriak and Allen (1998) *J. Am. Chem. Soc.*, 120: 1339-1340.

Clausen et al. (2000) *J. Org. Chem.*, 65: 7371-7378.

Cleland et al. (1995) *Faraday Commun.*, 91: 4001-4003.

Coulter et al. (2000) *J. Vac. Sci. Technol. A* 18: 1965-1970.

Gryko et al. (2000) *J. Org. Chem.*, 65: 7345-7355.

Li (2000) *J. Org. Chem.*, 65: 7379-7390.

Roth et al. (2000) *J. Vac. Sci. Technol. B.*, 18: 2359-2364.

Zhu et al. (1999) *Langmuir* 15: 8147-8154.

* cited by examiner

US 7,348,206 B2

FORMATION OF SELF-ASSEMBLED MONOLAYERS OF REDOX SAMS ON SILICON FOR MOLECULAR MEMORY APPLICATIONS

STATEMENT AS TO RIGHTS TO INVENTIONS MADE UNDER FEDERALLY SPONSORED RESEARCH AND DEVELOPMENT

This invention was made with Government Support under Grant No: N00014-99-0357, awarded by the Office of Naval Research. The Government of the United States of America may have certain rights in this invention.

CROSS-REFERENCE TO RELATED APPLICATIONS

[Not Applicable ]

FIELD OF THE INVENTION

This invention pertains to the field of semiconductor fabrication. In particular this invention provides novel methods of coupling organic molecules to group IV elements (e.g. silicon, germanium, etc.).

BACKGROUND OF THE INVENTION

The fabrication of ordered molecular assemblies on conducting silicon surfaces is of considerable interest owing to its potential applications in the microelectronic industry. One goal of semiconductor fabrication is to increase the density of active elements provided on an integrated circuit. In order to accomplish this, efforts have turned to the use of self-assembling molecular structures as an alternative to, or in conjunction with various lithographic processes to form the active elements used in integrated circuits.

In addition, interest has turned to the use of organic molecules to form such active elements (e.g. memory elements) (see, e.g., U.S. Pat. Nos. 6,272,038, 6,212,093, and 6,208,553, and PCT Publication WO 01/03126).

Organic molecules covalently attached to silicon are very stable due to the strength of Si—O and Si—C bonds. A number of approaches exist to form a covalent link between silicon and organic molecules (Buriak and Allen (1998) *J. Am. Chem. Soc.*, 120: 1339-1340; Bansal and Lewis (1998) *J. Phys. Chem.* 102: 1067-1070; Zhu et al. (1999) *Langmuir* 15: 8147-8154; Coulter et al. (2000) *J. Vac. Sci. Technol. A* 18: 1965-1970; Bourkherroub and Wayner (1999) *J. Am. Chem. Soc.* 121: 11513-11515; Cleland et al. (1995) *Faraday Commun.*, 91: 4001-4003; Bateman et al. (1998) *Angew. Chem. Int. Ed.*, 37: 2683-2685). These approaches include chemical, electrochemical and vapor deposition on a hydrogen-terminated silicon surface.

Such approaches, however, have typically involved difficult reaction conditions, have been relatively inefficient, have degraded the organic molecule(s), and/or have resulted in the production of fairly toxic materials.

SUMMARY OF THE INVENTION

This invention pertains to a new approach to couple an organic molecule to a surface, preferably to a surface of a Group IV element. The method is based on the formation of a Group VI element-O (e.g. Si—O), or a Group IV element-S (e.g. Si—S) bond. In preferred embodiments, the method involves the halogenation of the Group IV element surface. The surface is then contacted with a solvent comprising the organic molecule(s) where the organic molecule(s) are terminated with an alcohol or thiol under conditions where the solvent is rapidly removed from said surface whereby the organic molecule is coupled to said surface through an E-O— or E-S— bond where E is a group IV element (e.g. Si, Ge, etc.).

Thus, in one embodiment, this invention provides a method of coupling an organic molecule to a surface of a Group IV element (e.g. Si, Ge, etc.). the method involves halogenating the group IV element surface; providing a solution comprising the organic molecule where organic molecule is alcohol terminated or thiol terminated and the alcohol- or thiol-terminated organic molecule is in solvent; and contacting the solution with the surface under conditions where said solvent is rapidly removed from said surface whereby the organic molecule is coupled to said surface through an E-O— bond (where the organic molecule is alcohol-terminated) or an E-S— bond (where the organic molecule is thiol terminated) where E is the group IV element. In preferred embodiments, the Group IV element is silicon or germanium or doped (e.g. n-doped or p-doped) silicon or germanium. In particulary preferred embodiments, the group IV element surface is hydrogen passivated. The contacting can be performed in the presence of a base (e.g., 2,4,6-collidine, 2,6-lutidine, 2,6-di-tert-butylpyridine, 4-dimethylaminopyridine, trimethylamine, triethylamine, tributylamine, N,N-diisopropylethylamine, 1,8-bis(dimethylamino)naphthalene, 1,5-diazabicyclo[4.3.0]non-5-ene, 1,8-diazabicyclo[5.4.0]undec-7-ene, Na2CO3, $NH_3$, etc.).

In certain particularly preferred embodiments, the organic molecule is a redox-active molecule. Preferred redox-active molecules include, but are not limited to a porphyrinic macrocycle, a metallocene, a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide. In certain embodiments, the organic molecule comprises a molecule selected from the group consisting of a porphyrin, an expanded porphyrin, a contracted porphyrin, a ferrocene, a linear porphyrin polymer, a porphyrinic sandwich coordination complex, and a porphyrin array. Particularly preferred organic molecules include, but are not limited to a porphyrinic macrocycle substituted at a β-position or at a meso-position, or a porphyrinic macrocycle containing at least two porphyrins of equal energies held apart from each other at a spacing less than about 50 Å such that the molecule has an odd hole oxidation state permitting the hole to hop between said two porphyrins and where the odd hole oxidation state is different from and distinguishable from another oxidation state of the porphyrinic macrocycle.

In certain embodiments, the contacting comprises selectively applying the solution to certain regions of the group IV element surface and not to other regions. The contacting can comprise placing a protective coating on the surface in regions where the organic molecule is not to be attached; contacting said solution with the surface; and removing the protective coating to provide regions of the silicon surface without said organic molecule. In certain embodiments, the contacting can comprise contact printing the solution onto the surface. In certain embodiments, the contacting can comprise inkjet printing the solution onto the surface. In certain embodiments, the contacting can comprise spraying or dropping the solution onto the surface. The contacting can comprises coating the surface with the solution. In certain embodiments, the method further comprises etching, or otherwise treating, regions of the surface to remove the organic molecule.

In certain embodiments, when the organic molecule is terminated with an alcohol preferred alcohols include, but are not limited to a primary alcohol, a secondary alcohol, a tertiary alcohol, a benzyl alcohol, and an aryl alcohol. In certain embodiments, when the organic molecule is terminated with a thiol preferred thiols include, but are not limited to a primary thiol, a secondary thiol, a tertiary thiol, a benzyl thiol, and an arylthiol.

In preferred embodiments, the solvent is a high-boiling solvent. Particularly preferred solvents include, but are not limited to mesitylene, durene, o-dichlorobenzene, 1,2,4,-trichlorobenzene, 1-chloronaphthalene, 2-chloronaphthalene, N,N-dimethylformamide, N,N-dimethylacetamide, N,N-dimethylpropionamide, benzonitrile, and anisole.

In certain embodiments, the surface is heated (e.g. to a temperature of at least about 70° C.) and the solution is applied to the surface whereby said solvent boils off of the surface.

In certain embodiments, the solvent is applied to the surface and the surface is subjected to a vacuum that boils the solvent off of said surface. In certain embodiments, the halogenating comprises contacting said surface with a halogen selected from the group consisting of iodine, bromine, fluorine, and chlorine. In certain embodiments, the halogenating comprises contacting the surface with a reagent selected from the group consisting of N-bromosuccinimide, N-chlorosuccinimide, N-iodosuccinimide, ICl, $SO_2Cl_2$, $BrCCl_3$, $PCl_5$, $CBr_4$, $Br_2$+HgO, $MoCl_5$, $CF_3OF$, $AgSbF_6$, PhSe(O)Cl, $AlCl_3$, $AlBr_3$, and $Cl_2O$. In certain embodiments, the halogenating comprises contacting the surface with a free radical initiator (e.g., UV light, benzoyl peroxide, AIBN (2,2¢-azobisisobutyronitrile), and the like).

In another embodiment, this invention provides a group IV element (e.g. Si, Ge, etc.) surface having an organic molecule coupled thereto through an E—O— bond or through an E—S— bond where the organic molecule is coupled to the surface by the methods described herein. In preferred embodiments, the surface is p- or n-doped. In certain embodiments, the organic molecule is a redox-active molecule or a binding partner. In particularly preferred embodiments, the surface can retain a charge per unit area of at least about 100 m coulombs per $cm^2$ for each non-zero oxidation state of the redox-active molecule.

In still another embodiment, this invention provides a redox-active substrate comprising a group IV element (e.g. silicon, germanium, etc.) surface having attached thereto a redox-active molecule where, when said surface is silicon, said redox-active molecule is attached to said silicon surface through an Si—O bond or an Si—S bond; when said surface is germanium, said redox-active molecule is attached to said silicon surface through a Ge—O bond or a Ge—S bond (e.g. the redox-active molecule is attached to the surface through an E-S— or an E-O— bond where E is the group IV element); and the redox-active substrate can retain a charge per unit area of at least about 100 m coulombs per $cm^2$ for each non-zero oxidation state of the redox-active molecule. In certain preferred embodiments, the surface is a doped silicon surface (e.g. p- or n-doped). In certain preferred embodiments, the surface is a doped germanium surface (e.g. p- or n-doped). In particularly preferred embodiments, the surface is a hydrogen passivated surface. In certain preferred substrates, the redox-active is selected from the group consisting of a porphyrinic macrocycle, a metallocene, a linear polyene, a cyclic polyene, a heteroatom-substituted linear polyene, a heteroatom-substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'-bipyridyl, a 4,4'-bipyridyl, a tetrathiotetracene, and a peri-bridged naphthalene dichalcogenide. Particulalry preferred redox-active molecules include, but are not limited to a porphyrin, an expanded porphyrin, a contracted porphyrin, a ferrocene, a linear porphyrin polymer, a porphyrinic sandwich coordination complex, and a porphyrin array. In certain embodiments, the redox-active molecule is a porphyrinic macrocycle substituted at a β-position or at a meso-position, or a porphyrinic macrocycle containing at least two porphyrins of equal energies held apart from each other at a spacing less than about 50 Å such that the molecule has an odd hole oxidation state permitting the hole to hop between said two porphyrins and where the odd hole oxidation state is different from and distinguishable from another oxidation state of the porphyrinic macrocycle.

The substrate can further comprise integrated circuit elements (e.g. transistors, diodes, rectifiers, logic gates, etc.).

In still yet another embodiment, this invention provides an apparatus for storing data. The apparatus comprises a fixed electrode electrically coupled to a redox active molecule having two or more different and distinguishable oxidation states where data is stored in an oxidation state by the addition or withdrawal of one or more electrons from the redox-active molecule via the electrically coupled electrode, and further wherein the redox-active molecule is coupled to a silicon surface through an Si—O bond or an Si—S— bond, or said redox-active molecule is coupled to a germanium surface through a Ge—O— bond or through a Ge—S— bond. In a preferred apparatus, the apparatus can retain a charge per unit area of at least about 100 m coulombs per $cm^2$ for each non-zero oxidation state of the redox-active molecule. A particularly preferred apparatus stores data at a density of at least one bit per molecule. In certain embodiments, the redox-active molecule has at least eight different and distinguishable oxidation states.

In certain embodiments, the redox-active molecule is electronically coupled to a second fixed electrode that is a reference electrode. The redox-active molecule can be present at a multiplicity of locations on the surface. In certain embodiments, each location is addressed by a single electrode. In certain embodiments, each location is addressed by two electrodes. The electrode can be connected to a voltage source (e.g. the output of an integrated circuit). The electrode can be connected to a device to read the oxidation state of the redox-active molecule. Preferred redox-active molecules include, but are not limited to the redox-active molecules identified herein.

This invention also provides a method of fabricating an ordered molecular assembly. The method involves halogenating a group IV element (e.g. Ge, Si, etc.) surface, providing a solution comprising an organic molecule wherein said organic molecule is alcohol- or thiol-terminated and the alcohol- or thiol-terminated organic molecule is in solvent; and contacting said solution with the surface at a multiplicity of discrete locations on the surface under conditions where said solvent is rapidly removed from the surface whereby said organic molecule is coupled to said surface through an Si—O or an Si—S— bond.

DEFINITIONS

The term "oxidation" refers to the loss of one or more electrons in an element, compound, or chemical substituent/subunit. In an oxidation reaction, electrons are lost by atoms of the element(s) involved in the reaction. The charge on these atoms must then become more positive. The electrons are lost from the species undergoing oxidation and so electrons appear as products in an oxidation reaction. An oxidation is taking place in the reaction $Fe^{2+}(aq) \rightarrow Fe^{3+}(aq) + e^-$ because electrons are lost from the species being oxidized, $Fe^{2+}(aq)$, despite the apparent production of electrons as "free" entities in oxidation reactions. Conversely the term reduction refers to the gain of one or more electrons by an element, compound, or chemical substituent/subunit.

An "oxidation state" refers to the electrically neutral state or to the state produced by the gain or loss of electrons to an element, compound, or chemical substituent/subunit. In a preferred embodiment, the term "oxidation state" refers to states including the neutral state and any state other than a neutral state caused by the gain or loss of electrons (reduction or oxidation).

The term "multiple oxidation states" means more than one oxidation state. In preferred embodiments, the oxidation states may reflect the gain of electrons (reduction) or the loss of electrons (oxidation).

The terms "different and distinguishable" when referring to two or more oxidation states means that the net charge on the entity (atom, molecule, aggregate, subunit, etc.) can exist in two different states. The states are said to be "distinguishable" when the difference between the states is greater than thermal energy at room temperature (e.g. 0° C. to about 40° C.).

The term "tightly coupled" when used in reference to a subunit of a multi-subunit (e.g., polymeric) storage molecule of this invention refers to positioning of the subunits relative to each other such that oxidation of one subunit alters the oxidation potential(s) of the other subunit. In a preferred embodiment the alteration is sufficient such that the (non-neutral) oxidation state(s) of the second subunit are different and distinguishable from the non-neutral oxidation states of the first subunit. In a preferred embodiment the tight coupling is achieved by a covalent bond (e.g. single, double, triple, etc.). However, in certain embodiments, the tight coupling can be through a linker, via an ionic interaction, via a hydrophobic interaction, through coordination of a metal, or by simple mechanical juxtaposition. It is understood that the subunits could be so tightly coupled that the redox processes are those of a single supermolecule.

The term "electrode" refers to any medium capable of transporting charge (e.g. electrons) to and/or from a storage molecule. Preferred electrodes are metals or conductive organic molecules. The electrodes can be manufactured to virtually any 2-dimensional or 3-dimensional shape (e.g. discrete lines, pads, planes, spheres, cylinders, etc.).

The term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g. a writing or recording "head", an atomic force microscope (AFM) tip, a scanning tunneling microscope (STM) tip, etc.).

The term "working electrode" is used to refer to one or more electrodes that are used to set or read the state of a storage medium and/or storage molecule.

The term "reference electrode" is used to refer to one or more electrodes that provide a reference (e.g. a particular reference voltage) for measurements recorded from the working electrode. In preferred embodiments, the reference electrodes in a memory device of this invention are at the same potential although in some embodiments this need not be the case.

The term "electrically coupled" when used with reference to a storage molecule and/or storage medium and electrode refers to an association between that storage medium or molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g. via a linker), direct or indirect ionic bonding between the storage medium/molecule and the electrode, or other bonding (e.g. hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

The term "redox-active unit" or "redox-active subunit" refers to a molecule or component of a molecule that is capable of being oxidized or reduced by the application of a suitable voltage.

The term "redox-active" molecule refers to a molecule or component of a molecule that is capable of being oxidized or reduced by the application of a suitable voltage.

The term "subunit", as used herein, refers to a redox-active component of a molecule.

The terms "storage molecule" or "memory molecule" refer to a molecule having one or more oxidation states that can be used for the storage of information (e.g. a molecule comprising one or more redox-active subunits). Preferred storage molecules have two or more different and distinguishable non-neutral oxidation states.

The term "storage medium" refers to a composition comprising two or more storage molecules. The storage medium can contain only one species of storage molecule or it can contain two or more different species of storage molecule. In preferred embodiments, the term "storage medium" refers to a collection of storage molecules. Preferred storage media comprise a multiplicity (at least 2) of different and distinguishable (preferably non-neutral) oxidation states. The multiplicity of different and distinguishable oxidation states can be produced by the combination of different species of storage molecules, each species contributing to said multiplicity of different oxidation states and each species having a single non-neutral oxidation state. Alternatively or in addition, the storage medium can comprise one or more species of storage molecule having a multiplicity of non-neutral oxidation states. The storage medium can contain predominantly one species of storage molecule or it can contain a number of different storage molecules. The storage media can also include molecules other than storage molecules (e.g. to provide chemical stability, suitable mechanical properties, to prevent charge leakage, etc.).

The term "electrochemical cell" typically refers to a reference electrode, a working electrode, a redox-active molecule (e.g. a storage medium), and, if necessary, some means (e.g., a dielectric) for providing electrical conductivity between the electrodes and/or between the electrodes and the medium. In some embodiments, the dielectric is a component of the storage medium.

The terms "memory element", "memory cell", or "storage cell" refer to an electrochemical cell that can be used for the storage of information. Preferred "storage cells" are discrete regions of storage medium addressed by at least one and preferably by two electrodes (e.g. a working electrode and a reference electrode). The storage cells can be individually addressed (e.g. a unique electrode is associated with each memory element) or, particularly where the oxidation states of different memory elements are distinguishable, multiple memory elements can be addressed by a single electrode. The memory element can optionally include a dielectric (e.g. a dielectric impregnated with counterions).

The term "storage location" refers to a discrete domain or area in which a storage medium is disposed. When addressed with one or more electrodes, the storage location may form a storage cell. However if two storage locations contain the same storage media so that they have essentially the same oxidation states, and both storage locations are commonly addressed, they may form one functional storage cell.

"Addressing" a particular element refers to associating (e.g., electrically coupling) that memory element with an electrode such that the electrode can be used to specifically determine the oxidation state(s) of that memory element.

The terms "read" or "interrogate" refer to the determination of the oxidation state(s) of one or more molecules (e.g. molecules comprising a storage medium).

The term "refresh" when used in reference to a storage molecule or to a storage medium refers to the application of a voltage to the storage molecule or storage medium to re-set the oxidation state of that storage molecule or storage medium to a predetermined state (e.g. an oxidation state the storage molecule or storage medium was in immediately prior to a read).

The term "$E_{1/2}$" refers to the practical definition of the formal potential ($E°$) of a redox process as defined by $E=E°+(RT/nF)\ln(D_{ox}/D_{red})$ where R is the gas constant, T is temperature in K (Kelvin), n is the number of electrons involved in the process, F is the Faraday constant (96,485 Coulomb/mole), $D_{ox}$ is the diffusion coefficient of the oxidized species and $D_{red}$ is the diffusion coefficient of the reduced species.

A "voltage source" is any source (e.g. molecule, device, circuit, etc.) capable of applying a voltage to a target (e.g. an electrode).

The phrase "output of an integrated circuit" refers to a voltage or signal produced by a one or more integrated circuit(s) and/or one or more components of an integrated circuit.

A "voltammetric device" is a device capable of measuring the current produced in an electrochemical cell as a result of the application of a voltage or change in voltage.

An "amperometric device" is a device capable of measuring the current produced in an electrochemical cell as a result of the application of a specific potential field potential ("voltage").

A "potentiometric device" is a device capable of measuring potential across an interface that results from a difference in the equilibrium concentrations of redox molecules in an electrochemical cell.

A "coulometric device" is a device capable of the net charge produced during the application of a potential field ("voltage") to an electrochemical cell.

An "impedance spectrometer" is a device capable of determining the overall impedance of an electrochemical cell.

A "sinusoidal voltammeter" is a voltammetric device capable of determining the frequency domain properties of an electrochemical cell.

The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Preferred porphyrinic macrocycles comprise at least one 5-membered ring.

The term "porphyrin" refers to a cyclic structure typically composed of four pyrrole rings together with four nitrogen atoms and two replaceable hydrogens for which various metal atoms can readily be substituted. A typical porphyrin is hemin.

The term "multiporphyrin array" refers to a discrete number of two or more covalently-linked porphyrinic macrocycles. The multiporphyrin arrays can be linear, cyclic, or branched.

The terms "sandwich coordination compound" or "sandwich coordination complex" refer to a compound of the formula $L_nM_{n-1}$, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) *Chemical Society Reviews* 26: 433-442). Sandwich coordination complexes include, but are not limited to "double-decker sandwich coordination compound" and "triple-decker sandwich coordination compounds". The synthesis and use of sandwich coordination compounds is described in detail in U.S. Pat. No. 6,212,093B1.

The term "double-decker sandwich coordination compound" refers to a sandwich coordination compound as described above where n is 2, thus having the formula $L^1$—$M^1$—$L^2$, wherein each of $L^1$ and $L^2$ may be the same or different (see, e.g., Jiang et al. (1999) *J. Porphyrins Phthalocyanines* 3: 322-328).

The term "triple-decker sandwich coordination compound" refers to a sandwich coordination compound as described above where n is 3, thus having the formula $L^1$—$M^1$—$L^2$—$M^2$—$L^3$, wherein each of $L^1$, $L^2$ and $L^3$ may be the same or different, and $M^1$ and $M^2$ may be the same or different (see, e.g., Arnold et al. (1999) *Chemistry Letters* 483-484).

A "linker" is a molecule used to couple two different molecules, two subunits of a molecule, or a molecule to a substrate.

A "substrate" is a, preferably solid, material suitable for the attachment of one or more molecules. Substrates can be formed of materials including, but not limited to glass, plastic, silicon, germanium, minerals (e.g. quartz), semiconducting materials (e.g. doped silicon, doped germanium, etc.), ceramics, metals, etc.

The term "aryl" refers to a compound whose molecules have the ring structure characteristic of benzene, naphthalene, phenanthrene, anthracene, etc. (i.e., either the 6-carbon ring of benzene or the condensed 6-carbon rings of the other aromatic derivatives). For example, an aryl group may be phenyl ($C_6H_3$) or naphthyl ($C_{10}H_9$). It is recognized that the aryl group, while acting as substituent can itself have additional substituents (e.g. the substituents provided for S" in the various Formulas herein).

The term "alkyl" refers to a paraffinic hydrocarbon group which may be derived from an alkane by dropping one hydrogen from the formula. Examples are methyl ($CH_3$—), ethyl ($C_2H_5$—), propyl ($CH_3CH_2CH_2$—), isopropyl (($CH_3$)$_2CH_3$—).

The term "halogen" refers to one or the electronegative elements of group VIIB of the periodic table (fluorine, chlorine, bromine, iodine, astatine).

The term "nitro" refers to the $NO_2$ group.

The term "amino" refers to the $NH_2$ group.

The term "perfluoroalkyl" refers to an alkyl group where every hydrogen atom is replaced with a fluorine atom.

The term "perfluoroaryl" refers to an aryl group where every hydrogen atom is replaced with a fluorine atom.

The term "pyridyl" refers to an aryl group where one CH unit is replaced with a nitrogen atom.

The term "cyano" refers to the —CN group.

The term "thiocyanato" refers to the —SCN group.

The term "sulfoxyl" refers to a group of composition RS(O)— where R is some alkyl, aryl, cycloalkyl, perfluoroalkyl, or perfluoroaryl group. Examples include, but are not limited to methylsulfoxyl, phenylsulfoxyl, etc.

The term "sulfonyl" refers to a group of composition $RSO_2$— where R is some alkyl, aryl, cycloalkyl, perfluoroalkyl, or perfluoroaryl group. Examples include, but are not limited to methylsulfonyl, phenylsulfonyl, p-toluenesulfonyl, etc.

The term "carbamoyl" refers to the group of composition $R^1(R^2)NC(O)$— where $R^1$ and $R^2$ are H or some alkyl, aryl, cycloalkyl, perfluoroalkyl, or perfluoroaryl group. Examples include, but are not limited to N-ethylcarbamoyl, N,N-dimethylcarbamoyl, etc The term "amido" refers to the group of composition $R^1CON(R^2)$— where $R^1$ and $R^2$ are H or some alkyl, aryl, cycloalkyl, perfluoroalkyl, or perfluoroaryl group. Examples include, but are not limited to acetamido, N-ethylbenzamido, etc.

The term "acyl" refers to an organic acid group in which the OH of the carboxyl group is replaced by some other substituent (RCO—). Examples include, but are not limited to acetyl, benzoyl, etc.

In preferred embodiments, when a metal is designated by "M" or "M'", where n is an integer, it is recognized that the metal may be associated with a counterion.

The term "substituent" as used in the formulas herein, particularly designated by S or S" where n is an integer, in a preferred embodiment refer to redox-active groups (subunits) that can be used to adjust the redox potential(s) of the subject compound. Preferred substituents include, but are not limited to, aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl. In preferred embodiments, a substituted aryl group is attached to a porphyrin or a porphyrinic macrocycle, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, amido, and carbamoyl.

Particularly preferred substituents include, but are not limited to, 4-chlorophenyl, 3-acetamidophenyl, 2,4-dichloro-4-trifluoromethyl). Preferred substituents provide a redox potential range of less than about 5 volts, preferably less than about 2 volts, more preferably less than about 1 volt.

The phrase "provide a redox potential range of less than about X volts" refers to the fact that when a substituent providing such a redox potential range is incorporated into a compound, the compound into which it is incorporated has an oxidation potential less than or equal to X volts, where X is a numeric value.

The phrase "rapidly removed" when used in reference to a solvent comprising the organic molecule that is to be attached to the group IV element refers to a solvent that is substantially or completely removed within about 1 hour, more preferably within about 20 minutes, still more preferably within about 10 minutes, and most preferably within about 5 minutes, 2 minutes or 1 minute under particular conditions (e.g. at a particular temperature, vacuum, etc.).

A "high boiling solvent" refers to a solvent having a boiling point greater than about 130° C., preferably greater than about 150° C., more preferably greater than about 180° C., and most preferably greater than about 200° C.).

BRIEF DESCRIPTION OF THE DRAWINGS

FIG. 3A shows the results of single-drop casting (2% Fc-$CH_2OH$ in chloroform) on a hydrogen-passivated silicon surface. The material was kept in a glove box at room temperature for 2 hours. FIG. 3B shows the results of single-drop casting (2% Fc-$CH_2OH$ in chloroform) on a halogenated (iodide-modified) silicon surface. The material was kept in a glove box at room temperature for 2 hours. FIG. 3C shows the results of dropwise-addition of the coupling reagent (2% Fc-$CH_2OH$ in benzonitrile) on a hydrogen-passivated silicon surface heated on a hotplate at 70° C. for 2 hours in a glove box. FIG. 3D shows the results of a dropwise-addition of the coupling reagent (2% Fc-CH$_2$OH) in benzonitrile onto a halogenated (iodide-modified) silicon surface heated on a hotplate at 70° C. for 2 hours in a glove box. Electrochemical measurements were made as follows: Scan rate, 1 V/s; 1 M tetrabutylammonium hexafluorophosphate (TBAH) in methylene chloride (A, B and C) and propylene carbonate (D); approx. diameters of silicon electrodes, 3 mm (A and B), 1 mm (C) and 2 mm (D).

FIG. 4A shows the results of single-drop casting on a hydrogen-passivated silicon surface. FIG. 4B shows the results of single-drop casting on iodide-modified silicon surface. FIG. 4C shows the results of dropwise-addition of the coupling solution onto a hydrogen-passivated silicon surface. FIG. 4A shows the results of dropwise-addition of the coupling solution onto an iodide-modified silicon surface. Electrochemical measurements (sinusoidal voltammetry) were made as follows: Scan rate, 10 V/s; 1 M TBAH in methylene chloride (A, B and D) and acetonitrile (C); approx. diameters of silicon electrodes, 1 mm (A and B) and 2 mm (C and D).

DETAILED DESCRIPTION

Figure 1A:
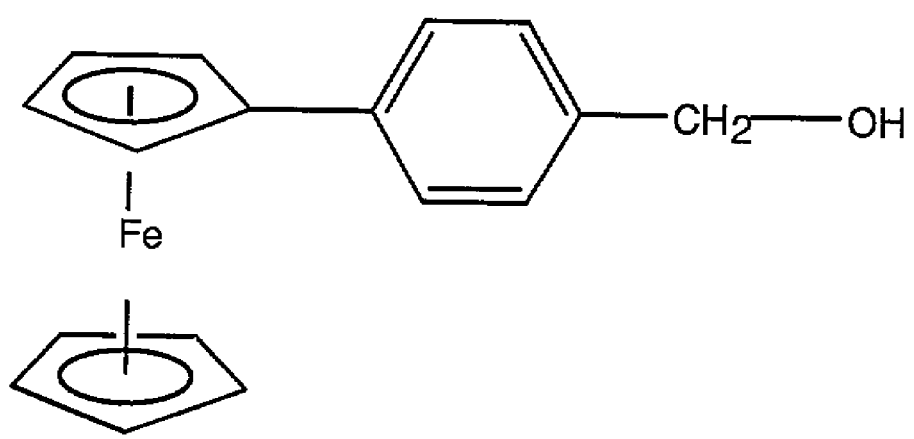
FIGS. 1A and 1B illustrate a ferrocene alcohol (Fc-$CH_2OH$) and a porphyrin alcohol (Por-$CH_2OH$), respectively, that can be used in the methods of this invention.

This invention pertains to a new approach to couple an organic molecule to a surface, preferably to a surface of a Group IV element. The method is based on the formation of a Group VI element-O (e.g. Si—O), or a Group IV element-S (e.g. Si—S) bond. In preferred embodiments, the method involves the halogenation of the Group IV element surface. The surface is then contacted with a solvent comprising the organic molecule(s) where the organic molecule(s) are terminated with an alcohol or thiol. The surface is contacted with the solvent under conditions where the solvent is rapidly removed from the surface. This results in coupling of the organic molecule to the surface through an E-O— or an E-S— bond where E is a Group IV element.

The halogenation of the Group IV element surface provides a good leaving group. The alcohol or thiol participates in a nucleophilic attack on the Group IV element-halide. The rapid removal of the solvent creates a high surface concentration of the organic molecule that drives the reaction. In particularly preferred embodiments, the reaction is performed in the presence of a base. Without being bound to a particular theory, it is believed that the base performs two functions. First, it is believed that base neutralizes (i.e. sponges up) acid produced during the reaction and thus helps to drive the reaction. Second, it is believed the base facilitates nucleophilic attack of the alcohol or thiol on the Group IV element-halogen (e.g. Si—I) and thereby acts as a catalyst driving the reaction.

Surface Preparation.

The methods of this invention are suitable for use with essentially all Group IV elements (e.g. carbon, silicon, germanium, tin, lead). In particularly preferred embodiments the Group IV element is silicon or germanium.

The group IV element can be essentially pure, or it can be doped (e.g. p- or n-doped). P- and n-dopants for use with Group IV elements, in particular for use with silicon or germanium are well known to those of skill in the art. Such dopants include, but are not limited to phosphorous compounds, boron compounds, arsenic compounds, aluminum compounds, and the like.

The Group IV element can take essentially any form. For example, it can be provided as a planar substrate, an etched substrate, a deposited domain on another substrate and the like. Particularly preferred forms include those forms of common use in solid state electronics fabrication processes.

In preferred embodiments the Group IV element is cleaned before use, e.g. using standard methods known to those of skill in the art. Thus, for example, in one preferred embodiment, the Group IV element is cleaned by sonication in a series of solvents (e.g. acetone, toluene, acetone, ethanol, and water) and then exposed to a standard wafer-cleaning solution (e.g. Piranha (sulfuric acid: 30% hydrogen peroxide, 2:1)) at elevated temperature (e.g. 100° C.).

In particularly preferred embodiments, oxides are removed from the substrate surface and the surface is hydrogen passivated. A number of approaches to hydrogen passivation are well known to those of skill in the art. For example, in one approach, a flow of molecular hydrogen is passed through dense microwave plasma across a magnetic field. The magnetic field serves to protect the sample surface from being bombarded by charged particles. Hence the crossed beam (CB) method makes it possible to avoid plasma etching and heavy ion bombardment that are so detrimental for many semiconductor devices (see, e.g., Balmashnov, et al. (1990) *Semiconductor Science and Technology*, 5: 242). In one particularly preferred embodiment, passivation is by contacting the surface to be passivated with an ammonium fluoride solution (preferably sparged of oxygen).

Other methods of cleaning and passivating a Group IV element surface are known to those of skill in the art (see, e.g., Choudhury (1997) *The Handbook of Microlithography, Micromachining, and Microfabrication*, Soc. Photo-Optical Instru. Engineer, Bard & Faulkner (1997) *Fundamentals of Microfabrication*, and the like).

The cleaned and preferably passivated surface is then halogenated. In one embodiment, halogenation is accomplished by contacting the surface with a solvent containing a halide (e.g. a saturated solution of I$_2$ in chloroform). Other suitable halogenation reagents include, but are not limited to: include N-bromosuccinimide, N-chlorosuccinimide, N-iodosuccinimide, ICl, SO$_2$Cl$_2$, BrCCl$_3$, PCl$_5$, CBr$_4$, Br$_2$+ HgO, MoCl$_5$, CF$_3$OF, AgSbF$_6$, PhSe(O)Cl, AlCl$_3$, AlBr$_3$, Cl$_2$O, and the like.

Halogenation can also be accomplished using free-radical initiators such as UV light, benzoyl peroxide, and AIBN (2,2'-azobisisobutyronitrile), and the like.

In certain embodiments, the entire surface of the Group IV element is halogenated. In other embodiments, one or more discrete areas (i.e. areas where the organic molecule is to be attached) are selectively halogenated. In preferred embodiments, this is accomplished by selectively contacting the halogenating reagent(s) to the region(s) that are to ber halogenated.

Means of accomplishing such selective exposure of the surface to various reagents are well known to those of skill in the art. In one embodiment, the surface that is not to be halogenated or subsequently coupled to the organic molecule(s) is shielded with a protective resist. The resist can be selectively patterned using well-known photolithographic techniques. In other embodiments selective patterning of the halogenating reagent(s) can be accomplished by the use of dams, by contact printing of the halogenating reagents, by "inkjet" printing of the halogenating reagents, and the like.

Coupling the Organic Molecule(s) to the Halogenated Group IV Element.

One or more species of organic molecule are then coupled to the halogenated substrate. The organic molecule(s) typically bear, or are derivatized to bear either a terminal alcohol or a terminal thiol. The alcohol or thiol can be attached directly to the organic molecule or can be coupled to the organic molecule through a linker, preferably an electrically conductive linker.

Means of derivatizing molecules with alcohols or thiols are well known to those of skill in the art (see, e.g., Gryko et al. (1999) *J. Org. Chem.*, 64: 8635-8647; Smith and March (2001) *March's Advanced Organic Chemistry*, John Wiley & Sons, 5th Edition, etc.).

Suitable alcohols include, but are not limited to a primary alcohol, a secondary alcohol, a tertiary alcohol, a benzyl alcohol, and an aryl alcohol (i.e., a phenol). Particularly preferred alcohols include, but are not limited to 2 to 10 carbon straight chain alcohols, , benzyl alcohol, and phenethyl alcohol.

Similarly, suitable thiols include, but are not limited to a primary thiol, a secondary thiol, a tertiary thiol, a benzyl thiol, and an aryl thiol. Particularly preferred thiols include, but are not limited to 2 to 10 carbon straight chain thiols, benzyl thiol, and phenethyl thiol.

The organic molecule is typically provided in a solvent. Preferred solvents are solvents that can be applied to the Group IV element without substantially degrading that substrate and that solubilize, but do not degrade the organic molecule(s) that are to be coupled to the substrate. Particularly preferred solvents include high-boiling solvents (e.g. solvents with an initial boiling point greater than about 130° C., preferably greater than about 150° C., more preferably greater than about 180° C.). In certain embodiments, a solvent is selected that is rapidly removed from the surface under particular conditions (heat, vacuum, etc.) thereby maintaining a local high concentration of organic molecule to drive the kinetics of the coupling reaction.

Particularly preferred solvents include, but are not limited to include mesitylene, durene, o-dichlorobenzene, 1,2,4,-trichlorobenzene, 1-chloronaphthalene, 2-chloronaphthalene, N,N-dimethylformamide, N,N-dimethylacetamide, N,N-dimethylpropionamide, benzonitrile, anisole, and the like.

Coupling of the organic molecule to the halogenated Group IV element is accomplished by contacting the solvent containing the organic molecule to the Group IV element, preferably under conditions that maintain a high concentration of organic molecule. In a particularly preferred embodiment, this is accomplished by heating the Group IV element surface, typically in an oxygen-free environment, and performing a dropwise addition of the solvent containing the organic molecule(s) to the surface. The solvent evaporates, relatively rapidly thereby maintaining a high organic molecule concentration. The alcohol or thiol reacts with the halogenated surface to attach the organic molecule to the surface through an E-O— bond or an E-S— bond where E is the Group IV element (e.g. Si, Ge, etc.).

The solvent can be removed by any of a number of other methods as well. Thus, for example, the dropwise addition can be performed under a partial or high vacuum while, optionally, heating the substrate. Alternatively, the solvent can be frozen or lyopholized on the substrate. In still another embodiment, a second reagent (e.g. co-solvent) can be applied to the surface that precipitates the organic molecule or that partitions the organic molecule away from the primary solvent. These methods are merely illustrative. Using the teaching and examples provided herein, approaches to maintain high organic molecule concentrations (e.g. remove solvent) will be known to those of skill in the art.

In particularly preferred embodiments, the coupling reaction is performed in the presence of a base. Without being bound to a particular theory, it is believed that the base neutralizes (i.e. sponges up) acid produced during the reaction and thus helps to drive the reaction. It is believed the base facilitates nucleophilic attack of the alcohol or thiol on the Group IV element-halogen (e.g. Si—I) and thereby acts as a catalyst driving the reaction.

Any of a great number of bases are suitable for use in the methods of this invention. Particularly preferred bases include, but are not limited to pyridine, 2,4,6-collidine, 2,6-lutidine, 2,6-di-tert-butylpyridine, 4-dimethylaminopyridine, trimethylamine, triethylarnine, tributylamine, N,N-diisopropylethylamine, 1,8-bis(dimethylamino)naphthalene, 1,5-diazabicyclo[4.3.0]non-5-ene, 1,8-diazabicyclo[5.4.0]undec-7-ene, $Na_2CO_3$, $NH_3$, and the like.

As indicated above, the location of attached organic molecules can be determined by the regions of the substrate that are halogenated. In addition, or alternatively, the location of the attached organic molecules can also be determined by selectively contacting particular regions of the Group IV element substrate with the solution comprising the organic molecules. Methods of selectively contacting particular regions of a surface with a reagent are well known to those of skill in the semiconductor industry.

The most common approach involves masking the areas of the surface that are to be free of the organic molecules so that the "coupling" solution cannot come in contact with those areas. This is readily accomplished by coating the substrate with a masking material (e.g. a polymer resist) and selectively etching the resist off of areas that are to be coupled. Alternatively a photoactivatible resist can be applied to the surface and selectively activated (e.g. via UV light) in areas that are to be protected. Such "photolithographic" methods are well known in the semiconductor industry (see e.g., Van Zant (2000) *Microchip Fabrication: A Practical Guide to Semiconductor Processing*; Nishi and Doering (2000) *Handbook of Semiconductor Manufacturing Technology*; Xiao (2000) *Introduction to Semiconductor Manufacturing Technology*; Campbell (1996) *The Science and Engineering of Microelectronic Fabrication* (*Oxford Series in Electrical Engineering*), Oxford University Press, and the like).

Other approaches involve contact printing of the reagents, e.g. using a contact printhead shaped to selectively deposit the reagent(s) in regions that are to be coupled, use of an inkjet apparatus (see e.g. U.S. Pat. No. 6,221,653) to selectively deposit reagents in particular areas, use of dams to selectively confine reagents to particular regions, and the like.

In certain preferred embodiments, the coupling reaction is repeated several times. After the reaction(s) are complete, uncoupled organic molecules are washed off of the surface, e.g. using standard wash steps (e.g., benzonitrile wash followed by sonication in dry methylene chloride).

High Charge Density Materials.

It was a surprising discovery of this invention that coupling of redox-active molecules to a doped or undoped group IV element substrate (e.g. Si, Ge) results in higher and more uniform packing of the organic molecules (e.g. redox-active species) than other previously known methods. With redox-active organic molecules this manifests as lower oxidative current at higher anodic potentials observed in voltammometric measurements. In addition, a cyclic voltammogram shows sharper and more symmetric peaks.

In addition, the improved uniformity and higher packing density of redox-active molecules on the substrate results in materials capable of storing a significantly higher charge density. Thus, in preferred embodiments, this invention provides a group IV element substrate having coupled thereto one or more redox-active species that can store charge at a charge density of at least about 75 μCoulombs/$cm^2$, preferably at least about 100 μCoulombs/$cm^2$, more preferably at least about 150 μCoulombs/$cm^2$, and most preferably of at least about 200 or 250 μCoulombs/$cm^2$ per non-zero oxidation state of the redox active molecules. Such materials are useful in the fabrication of molecular memories (memory chips).

Where various binding moieties are used instead of redox-active species, the high uniformity and molecule density provides sensors having greater sensitivity and selectivity for a particular analyte.

Uses of Organic Molecules Coupled to a Group IV Material.

The methods of this invention can be used to attach essentially any molecule that can be derivatized with an alcohol and/or a thiol to a Group IV element (e.g. silicon, germanium, etc.). In certain preferred embodiments, the molecule is a redox-active molecule and can be used to form a molecular memory. In other preferred embodiments, the molecule is a binding partner (e.g. antibody, ligand, nucleic acid, etc.) and can be used to form a sensor for detecting particular analyte(s).

Molecular Memory Applications.

In "molecular memory" redox-active molecules (molecules having one or more non-zero redox states) coupled to the Group IV element are used to store bits (e.g. each redox state can represent a bit). The redox-active molecule attached to the group IV element (e.g. silicon or germanium) forms a storage cell capable of storing one or more bits in various oxidation states. In certain embodiments, the storage cell is characterized by a fixed electrode electrically coupled to a "storage medium" comprising one or more redox-active molecules and having a multiplicity of different and distinguishable oxidation states. Data is stored in the (preferably non-neutral) oxidation states by the addition or withdrawal of one or more electrons from said storage medium via the electrically coupled electrode. The oxidation state of the redox-active molecule(s) can be set and/or read using electrochemical methods (e.g. cyclic voltammetry), e.g., as described in U.S. Pat. Nos. 6,272,038, 6,212,093, and 6,208,553 and PCT Publication WO 01/03126.

Because group IV elements, in particular silicon and germanium, are commonly used in electronic chip fabrication, the methods provided herein readily lend themselves to the fabrication of molecular memory chips compatible with existing processing/fabrication technologies. In addition, details on the construction and use of storage cells comprising redox-active molecules can be found, in U.S. Pat. Nos. 6,272,038, 6,212,093, and 6,208,553 and PCT Publication WO 01/03126.

Certain preferred redox-active molecules suitable for use in this invention are characterized by having a multiplicity of oxidation states. Those oxidation states are provided by one or more redox-active units. A redox-active unit refers to a molecule or to a subunit of a molecule that has one or more discrete oxidation states that can be set by application of an appropriate voltage. Thus, for example, in one embodiment, the redox-active molecule can comprise two or more (e.g. 8) different and distinguishable oxidation states. Typically, but not necessarily, such multi-state molecules will be composed of several redox-active units (e.g. porphyrins or ferrocenes). Each redox-active molecule is itself at least one redox-active unit, or comprises at least one redox-active unit, but can easily comprise two or more redox-active units.

Preferred redox-active molecules include, but are not limited to porphyrinic macrocycles. The term "porphyrinic macrocycle" refers to a porphyrin or porphyrin derivative. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, β-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Preferred porphyrinic macrocycles comprise at least one 5-membered ring.

The term "porphyrin" refers to a cyclic structure typically composed of four pyrrole rings together with four nitrogen atoms and two replaceable hydrogens for which various metal atoms can readily be substituted. A typical porphyrin is hemin.

Particularly preferred redox-active molecules include a porphyrin, an expanded porphyrin, a contracted porphyrin, a ferrocene, a linear porphyrin polymer, a porphyrin sandwich coordination complex, and a porphyrin array.

In one preferred embodiment, the redox-active molecule is a metallocene as shown in Formula I.

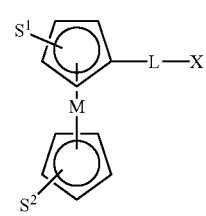

I where L is a linker, M is a metal (e.g., Fe, Ru, Os, Co, Ni, Ti, Nb, Mn, Re, V, Cr, W), $S^1$ and $S^2$ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. In preferred embodiments, a substituted aryl group is attached to the porphyrin, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

Particularly preferred substituents include, but are not limited to, 4-chlorophenyl, 3-acetamidophenyl, 2,4-dichloro-4-trifluoromethyl, and the like. Preferred substituents provide a redox potential range of less than about 2 volts. X is selected from the group consisting of a substrate, a reactive site that can covalently couple to a substrate (e.g. an alcohol, a thiol, etc.). It will be appreciated that in some embodiments, L—X is an alcohol or a thiol. In certain instances L—X can be replaced with another substituent ($S^3$) like $S^1$ or $S^2$. In certain embodiments, L—X can be present or absent, and when present preferably is 4-hydroxyphenyl, 4-(2-(4-hydroxyphenyl)ethynyl)phenyl, 4-(hydroxymethyl)phenyl, 4-mercaptophenyl, 4-(2-(4-mercaptophenyl)ethynyl)phenyl, 4-mercaptomethylphenyl, 4-hydroselenophenyl, 4-(2-(4-hydroselenophenyl)ethynyl)phenyl, 4-hydrotellurophenyl, 4-(hydroselenylmethyl)phenyl, 4-(2-(4-hydrotellurophenyl)ethynyl)phenyl, 4-(hydrotelluromethyl)phenyl, and the like.

The oxidation state of molecules of Formula I is determined by the metal and the substituents. Thus, particular preferred embodiments are illustrated by Formulas II-VII, (listed sequentially) below:

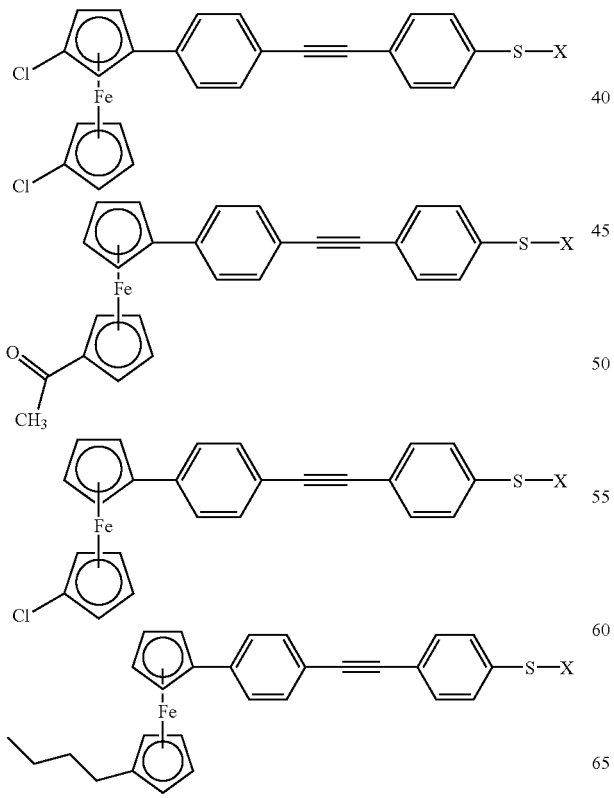

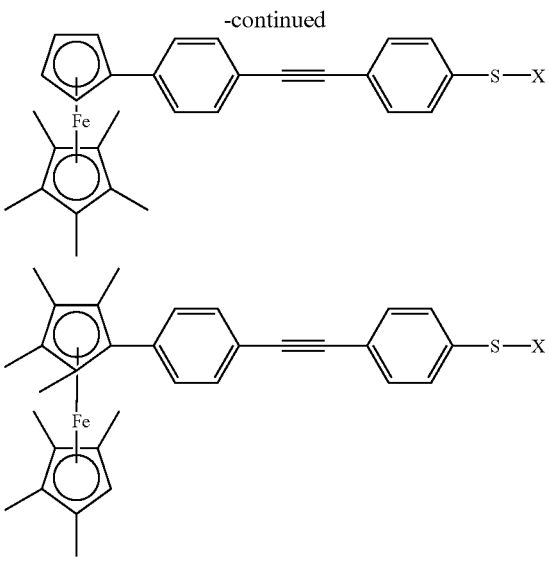

The ferrocenes listed above in Formulas II through VII provide a convenient series of one-bit molecules having different and distinguishable oxidation states. Thus the molecules of Formulas II through VII have oxidation states ($E_{1/2}$) of +0.55 V, +0.48 V, +0.39 V, +0.17 V, −0.05 V, and −0.18 V, respectively, and provide a convenient series of molecules for incorporation into a storage medium of this invention. It will be appreciated that the oxidation potentials of the members of the series can be routinely altered by changing the metal (M) or the substituents.

Another preferred redox-active molecule is a porphyrin illustrated by Formula VIII.

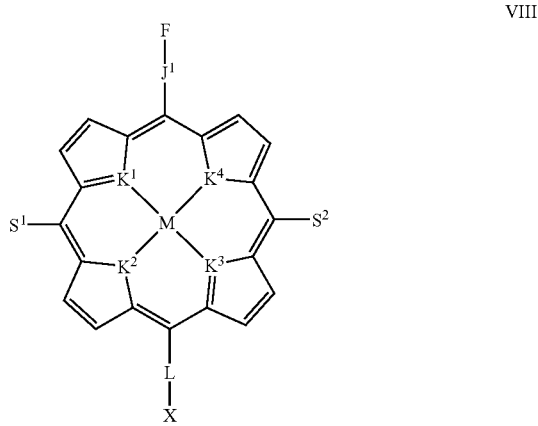

where, F is a redox-active subunit (e.g., a ferrocene, a substituted ferrocene, a metalloporphyrin, or a metallochlorin, etc.), $J^1$ is a linker, M is a metal (e.g., Zn, Mg, Cd, Hg, Cu, Ag, Au, Ni, Pd, Pt, Co, Rh, Ir, Mn, B, Al, Ga, Pb, and Sn), $S^1$ and $S^2$ are independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts, $K^1$, $K^2$, $K^3$, and $K^4$ are independently selected from the group consisting of N, O, S, Se, Te, and CH; L is a linker;

X is selected from the group consisting of a substrate, a reactive site that can covalently couple to a substrate, and a reactive site that can ionically couple to a substrate. In preferred embodiments, X or L—X is an alcohol or a thiol. In some embodiments L—X can be eliminated and replaced with a substituent independently selected from the same group as $S^1$ or $S^2$.

Control over the hole-storage and hole-hopping properties of the redox-active units of the redox-active molecules used in the memory devices of this invention allows fine control over the architecture of the memory device.

Such control is exercised through synthetic design. The hole-storage properties depend on the oxidation potential of the redox-active units or subunits that are themselves or that are used to assemble the redox-active storage media used in the devices of this invention. The hole-storage properties and redox potential can be tuned with precision by choice of base molecule(s), associated metals and peripheral substituents (Yang et al. (1999) *J. Porphyrins Phthalocyanines*, 3: 117-147).

For example, in the case of porphyrins, Mg porphyrins are more easily oxidized than Zn porphyrins, and electron withdrawing or electron releasing aryl groups can modulate the oxidation properties in predictable ways. Hole-hopping occurs among isoenergetic porphyrins in a nanostructure and is mediated via the covalent linker joining the porphyrins (Seth et al. (1994) *J. Am. Chem. Soc.*, 116: 10578-10592, Seth et al (1996) *J. Am. Chem. Soc.*, 118: 11194-11207, Strachan et al. (1997) *J. Am. Chem. Soc.*, 119: 11191-11201; Li et al. (1997) *J. Mater. Chem.*, 7: 1245-1262, Strachan et al. (1998) *Inorg. Chem.*, 37: 1191-1201, Yang et al. (1999) *J. Am. Chem. Soc.*, 121: 4008-4018).

The design of compounds with predicted redox potentials is well known to those of ordinary skill in the art. In general, the oxidation potentials of redox-active units or subunits are well known to those of skill in the art and can be looked up (see, e.g., *Handbook of Electrochemistry of the Elements*). Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

Various preferred redox-active molecules and the syntheses thereof are described in detail in U.S. Pat. Nos. 6,272,038, 6,212,093, and 6,208,553 and PCT Publication WO 01/03126.

Sensor/Assay Applications

In certain embodiments, the organic molecule is a binding partner. As used herein, the term "binding partner" or a member of a "binding pair" refers to a molecule or composition that specifically binds other molecules to form a binding complex such as antibody-antigen, lectin-carbohydrate, nucleic acid-nucleic acid, biotin-avidin, etc.

The binding partner, when coupled to a group IV element according to the methods of this invention can be used to capture (bind) and thereby immobilize a target analyte. The presence of the bound analyte can then be detected by any of a wide variety of means. For example, particularly where the binding partner is electrically coupled to an electrode, binding of a target analyte can be detected using electrochemical methods (e.g. cyclic/sinusoidal voltammetry, impedence spectrometry, coulometry, etc.).

The detection of bound target analytes using electrochemical methods is described in detail in U.S. Pat. Nos. 5,650,061, 5,958,215, and 6,294,392.

Other approaches can be used to detect the bound target analyte. Such approaches include, but are not limited to competitive assay formats, where the bound target analyte(s) displace a previously bound target (e.g. labeled target) and the amount of released target is measured and provides an indication of the presence or quantity of target analytes. Other assay formats include, but are not limited to sandwich assays in which the target analyte, after binding to the binding partner is then itself bound by a second molecule (e.g. an antibody specific for all or a part of the target analyte). The bound second molecule is then detected and provides a measure of the bound analyte. These assay formats are merely illustrative and not intended to be limiting. Using the teaching provided herein, other assay formats can readily be developed by one of skill in the art.

A single species of binding partner can be attached to a group IV element surface. Alternatively a plurality (e.g. at least 2, preferably at least 5, more preferably at least 10, and most preferably at least 20, 50, or 100) of different binding partners can be coupled to the group IV element surface. Where a plurality of binding partners are used, the sensor formed thereby can detect a number of different analytes. Such multi-analyte sensors are particularly well suited to complex analyses, or to various high-throughput screening systems.

The binding partner attached to a group IV element can function as the "detection element" of a sensor (e.g. a biosensor). The detection element can be fabricated as a "probe tip" that is inserted into a sample, or as a vessel or component of a vessel or surface to which a sample is applied. The detection element can also be a fixed component of a integrated detection and analysis system or as a removable "cassette".

Because group IV elements such as germanium and silicon are so amenable to micromachining and other microfabrication techniques (e.g., high energy sputtering techniques, low energy plasma techniques, reactive ion etching, etc., see, e.g., Choudhury (1997) *The Handbook of Microlithography, Micromachining, and Microfabrication*, Soc. Photo-Optical Instru. Engineer, Bard & Faulkner (1997) *Fundamentals of Microfabrication*, U.S. Pat. Nos. 5,194,133, 5,132,012, 4,908,112, and 4,891,120, and the like) the coupling methods of this invention are particularly well suited to incorporating organic molecules (e.g. binding partners) into "chip-based" formats for rapid screening. Various "lab on a chip" formats are well known to those of skill in the art (see, e.g., U.S. Pat. Nos. 6,132,685, 6,123,798, 6,107,044, 6,100,541, 6,090,251, 6,086,825, 6,086,740, 6,074,725, 6,071,478, 6,068,752, 6,048,498, 6,046,056, 6,042,710, and 6,042,709) and may readily be adapted for use with the methods of this invention.

Preferred binding partners specifically bind to the target analyte(s). The term "specifically binds", as used herein, when referring to a binding partner (e.g., protein, nucleic acid, antibody, etc.), refers to a binding reaction that is determinative of the presence of a target analyte in a heterogeneous population of molecules (e.g. proteins and other biologics). Thus, under designated conditions (e.g. immunoassay conditions in the case of an antibody, or stringent hybridization conditions in the case of a nucleic acid), the specified ligand or antibody binds to its particular "target" (e.g. a protein or nucleic acid) and does not bind in a significant amount to other molecules.

The binding partner(s) used in this invention are selected based upon the targets that are to be identified/quantified. Thus, for example, where the target is a nucleic acid the binding partner is preferably a nucleic acid or a nucleic acid binding protein. Where the target is a protein, the binding partner is preferably a receptor, a ligand, or an antibody that specifically binds that protein. Where the target is a sugar or glycoprotein, the binding partner is preferably a lectin, and so forth.

Suitable binding partners (capture agents) include, but are not limited to nucleic acids, proteins, receptor binding proteins, nucleic acid binding proteins, lectins, sugars, glycoproteins, antibodies, lipids, and the like. Methods of synthesizing or isolating such binding partners are well known to those of skill in the art. The binding partners can be readily derivatized to bear a thiol or an alcohol according to standard methods known to those of skill in the art. It is noted that where the binding partner is an antibody or a protein, cysteines, where present, will provide conveniently available thiol groups.

Preparation of Binding Partners (Capture Agents).

Nucleic Acids.

Nucleic acids for use as binding partners in this invention can be produced or isolated according to any of a number of methods well known to those of skill in the art. In one embodiment, the nucleic acid can be an isolated naturally occurring nucleic acid (e.g., genomic DNA, cDNA, mRNA, etc.). Methods of isolating naturally occurring nucleic acids are well known to those of skill in the art (see, e.g., Sambrook et al. (1989) *Molecular Cloning—A Laboratory Manual* (2nd Ed.), Vol. 1-3, Cold Spring Harbor Laboratory, Cold Spring Harbor, N.Y.).

However, in a preferred embodiment, the nucleic acid is created de novo, e.g. through chemical synthesis. In a preferred embodiment, nucleic acids (e.g., oligonucleotides) are chemically synthesized according to the solid phase phosphoramidite triester method described by Beaucage and Caruthers (1981), *Tetrahedron Letts.*, 22(20): 1859-1862, e.g., using an automated synthesizer, as described in Needham-VanDevanter et al. (1984) *Nucleic Acids Res.*, 12: 6159-6168. Purification of oligonucleotides, where necessary, is typically performed by either native acrylamide gel electrophoresis or by anion-exchange HPLC as described in Pearson and Regnier (1983) *J. Chrom.* 255: 137-149. The sequence of the synthetic oligonucleotides can be verified using the chemical degradation method of Maxam and Gilbert (1980) in Grossman and Moldave (eds.) Academic Press, New York, *Meth. Enzymol.* 65: 499-560.

Antibodies/antibody Fragments.

Antibodies or antibody fragments for use as binding partners (capture agents) can be produced by a number of methods well known to those of skill in the art (see, e.g., Harlow & Lane (1988) *Antibodies: A Laboratory Manual*, Cold Spring Harbor Laboratory, and Asai (1993) *Methods in Cell Biology* Vol. 37: *Antibodies in Cell Biology*, Academic Press, Inc. N.Y.). In one approach, the antibodies are produced by immunizing an animal (e.g. a rabbit) with an immunogen containing the epitope it is desired to recognize/ capture. A number of immunogens may be used to produce specifically reactive antibodies. Recombinant protein is the preferred immunogen for the production of monoclonal or polyclonal antibodies. Naturally occurring protein may also be used either in pure or impure form. Synthetic peptides made as well using standard peptide synthesis chemistry (see, e.g., Barany and Merrifield, *Solid-Phase Peptide Synthesis*; pp. 3-284 in *The Peptides: Analysis, Synthesis, Biology*. Vol. 2: *Special Methods in Peptide Synthesis, Part A.*, Merrifield et al. (1963) *J. Am. Chem. Soc.*, 85: 2149-2156, and Stewart et al. (1984) *Solid Phase Peptide Synthesis*, 2nd ed. Pierce Chem. Co., Rockford, Ill.)

Methods of production of polyclonal antibodies are known to those of skill in the art. In brief, an immunogen, preferably a purified cytoskeletal component, is mixed with an adjuvant and animals are immunized. The animal's immune response to the immunogen preparation is monitored by taking test bleeds and determining the titer of reactivity to the cytoskeletal components and test compositions. When appropriately high titers of antibody to the immunogen are obtained, blood is collected from the animal and antisera are prepared. Further fractionation of the antisera to enrich for antibodies reactive to the cytoskeletal component can be done if desired. (See Harlow and Lane, supra).

Monoclonal antibodies may be obtained by various techniques familiar to those skilled in the art. Briefly, spleen cells from an animal immunized with a desired antigen are immortalized, commonly by fusion with a myeloma cell (See, Kohler and Milstein (1976) *Eur. J. Immunol.* 6: 511-519). Alternative methods of immortalization include transformation with Epstein Barr Virus, oncogenes, or retroviruses, or other methods well known in the art. Colonies arising from single immortalized cells are screened for production of antibodies of the desired specificity and affinity for the antigen, and yield of the monoclonal antibodies produced by such cells may be enhanced by various techniques, including injection into the peritoneal cavity of a vertebrate host. Alternatively, one may isolate DNA sequences which encode a monoclonal antibody or a binding fragment thereof by screening a DNA library from human B cells according to the general protocol outlined by Huse et al. (1989) *Science*, 246:1275-1281.

Antibodies fragments, e.g. single chain antibodies (scFv or others), can also be produced/selected using phage display technology. The ability to express antibody fragments on the surface of viruses that infect bacteria (bacteriophage or phage) makes it possible to isolate a single binding antibody fragment from a library of greater than $10^{10}$ nonbinding clones. To express antibody fragments on the surface of phage (phage display), an antibody fragment gene is inserted into the gene encoding a phage surface protein (pIII) and the antibody fragment-pIII fusion protein is displayed on the phage surface (McCafferty et al. (1990) *Nature*, 348: 552-554; Hoogenboom et al. (1991) *Nucleic Acids Res.* 19: 4133-4137).

Since the antibody fragments on the surface of the phage are functional, phage bearing antigen binding antibody fragments can be separated from non-binding phage by antigen affinity chromatography (McCafferty et al. (1990) *Nature*, 348: 552-554). Depending on the affinity of the antibody fragment, enrichment factors of 20 fold-1,000,000 fold are obtained for a single round of affinity selection. By infecting bacteria with the eluted phage, however, more phage can be grown and subjected to another round of selection. In this way, an enrichment of 1000 fold in one round can become 1,000,000 fold in two rounds of selection (McCafferty et al. (1990) *Nature*, 348: 552-554). Thus even when enrichments are low (Marks et al. (1991) *J. Mol. Biol.* 222: 581-597), multiple rounds of affinity selection can lead to the isolation of rare phage. Since selection of the phage antibody library on antigen results in enrichment, the majority of clones bind antigen after as few as three to four rounds of selection. Thus only a relatively small number of clones (several hundred) need to be analyzed for binding to antigen.

Human antibodies can be produced without prior immunization by displaying very large and diverse V-gene repertoires on phage (Marks et al. (1991) *J. Mol. Biol.* 222: 581-597). In one embodiment natural $V_H$ and $V_L$ repertoires present in human peripheral blood lymphocytes are were isolated from unimmunized donors by PCR. The V-gene repertoires were spliced together at random using PCR to create a scFv gene repertoire which is was cloned into a phage vector to create a library of 30 million phage antibodies (Id.). From this single "naive" phage antibody library, binding antibody fragments have been isolated against more than 17 different antigens, including haptens, polysaccharides and proteins (Marks et al. (1991) *J. Mol. Biol.* 222: 581-597; Marks et al. (1993). *Bio/Technology.* 10: 779-783; Griffiths et al. (1993) *EMBO J.* 12: 725-734; Clackson et al. (1991) *Nature.* 352: 624-628). Antibodies have been produced against self proteins, including human thyroglobulin, immunoglobulin, tumor necrosis factor and CEA (Griffiths et al. (1993) *EMBO J.* 12: 725-734). It is also possible to isolate antibodies against cell surface antigens by selecting directly on intact cells. The antibody fragments are highly specific for the antigen used for selection and have affinities in the 1 :M to 100 nM range (Marks et al. (1991) *J. Mol. Biol.* 222: 581-597; Griffiths et al. (1993) *EMBO J.* 12: 725-734). Larger phage antibody libraries result in the isolation of more antibodies of higher binding affinity to a greater proportion of antigens.

Binding Proteins.

In one embodiment, the binding partner (capture agent) can be a binding protein. Suitable binding proteins include, but are not limited to receptors (e.g. cell surface receptors), receptor ligands, cytokines, transcription factors and other nucleic acid binding proteins, growth factors, etc.

The protein can be isolated from natural sources, mutagenized from isolated proteins or synthesized de novo. Means of isolating naturally occurring proteins are well known to those of skill in the art. Such methods include but are not limited to well known protein purification methods including ammonium sulfate precipitation, affinity columns, column chromatography, gel electrophoresis and the like (see, generally, R. Scopes, (1982) *Protein Purification*, Springer-Verlag, N.Y.; Deutscher (1990) *Methods in Enzymology* Vol. 182: *Guide to Protein Purification*, Academic Press, Inc. N.Y.).

Where the protein binds a target reversibly, affinity columns bearing the target can be used to affinity purify the protein. Alternatively the protein can be recombinantly expressed with a HIS-Tag and purified using $Ni^{2+}$/NTA chromatography.

In another embodiment, the protein can be chemically synthesized using standard chemical peptide synthesis techniques. Where the desired subsequences are relatively short the molecule may be synthesized as a single contiguous polypeptide. Where larger molecules are desired, subsequences can be synthesized separately (in one or more units) and then fused by condensation of the amino terminus of one molecule with the carboxyl terminus of the other molecule thereby forming a peptide bond. This is typically accomplished using the same chemistry (e.g., Fmoc, Tboc) used to couple single amino acids in commercial peptide synthesizers.

Solid phase synthesis in which the C-terminal amino acid of the sequence is attached to an insoluble support followed by sequential addition of the remaining amino acids in the sequence is the preferred method for the chemical synthesis of the polypeptides of this invention. Techniques for solid phase synthesis are described by Barany and Merrifield (1962) *Solid-Phase Peptide Synthesis*; pp. 3-284 in *The Peptides: Analysis, Synthesis, Biology.* Vol. 2: *Special Methods in Peptide Synthesis, Part A.*, Merrifield et al. (1963) *J. Am. Chem. Soc.*, 85: 2149-2156, and Stewart et al. (1984) *Solid Phase Peptide Synthesis*, 2nd ed. Pierce Chem. Co., Rockford, Ill.

In a preferred embodiment, the can also be synthesized using recombinant DNA methodology. Generally this involves creating a DNA sequence that encodes the binding protein, placing the DNA in an expression cassette under the control of a particular promoter, expressing the protein in a host, isolating the expressed protein and, if required, renaturing the protein.

DNA encoding binding proteins or subsequences of this invention can be prepared by any suitable method as described above, including, for example, cloning and restriction of appropriate sequences or direct chemical synthesis by methods such as the phosphotriester method of Narang et al. (1979) *Meth. Enzymol.* 68: 90-99; the phosphodiester method of Brown et al. (1979) *Meth. Enzymol.* 68: 109-151; the diethylphosphoramidite method of Beaucage et al. (1981) *Tetrahedron Lett.*, 22: 1859-1862; and the solid support method of U.S. Pat. No. 4,458,066.

The nucleic acid sequences encoding the desired binding protein(s) may be expressed in a variety of host cells, including *E. coli*, other bacterial hosts, yeast, and various higher eukaryotic cells such as the COS, CHO and HeLa cells lines and myeloma cell lines. The recombinant protein gene will be operably linked to appropriate expression control sequences for each host. For *E. coli* this includes a promoter such as the T7, trp, or lambda promoters, a ribosome binding site and preferably a transcription termination signal. For eukaryotic cells, the control sequences will include a promoter and preferably an enhancer derived from immunoglobulin genes, SV40, cytomegalovirus, etc., and a polyadenylation sequence, and may include splice donor and acceptor sequences.

The plasmids can be transferred into the chosen host cell by well-known methods such as calcium chloride transformation for *E. coli* and calcium phosphate treatment or electroporation for mammalian cells. Cells transformed by the plasmids can be selected by resistance to antibiotics conferred by genes contained on the plasmids, such as the amp, gpt, neo and hyg genes.

Once expressed, the recombinant binding proteins can be purified according to standard procedures of the art as described above.

Sugars and Carbohydrates.

Other binding partners include sugars and carbohydrates. Sugars and carbohydrates can be isolated from natural sources, enzymatically synthesized or chemically synthesized. A route to production of specific oligosaccharide structures is through the use of the enzymes which make them in vivo; the glycosyltransferases. Such enzymes can be used as regio- and stereoselective catalysts for the in vitro synthesis of oligosaccharides (Ichikawa et al. (1992) *Anal. Biochem.* 202: 215-238). Sialyltransferase can be used in combination with additional glycosyltransferases. For example, one can use a combination of sialyltransferase and galactosyltransferases. A number of methods of using glycosyltransferases to synthesize desired oligosaccharide structures are known. Exemplary methods are described, for instance, WO 96/32491, Ito et al. (1993) *Pure Appl. Chem.*

65:753, and U.S. Pat. Nos. 5,352,670, 5,374,541, and 5,545,553. The enzymes and substrates can be combined in an initial reaction mixture, or alternatively, the enzymes and reagents for a second glycosyltransferase cycle can be added to the reaction medium once the first glycosyltransferase cycle has neared completion. By conducting two glycosyltransferase cycles in sequence in a single vessel, overall yields are improved over procedures in which an intermediate species is isolated.

Methods of chemical synthesis are described by Zhang et al. (1999) *J. Am. Chem. Soc.*, 121(4): 734-753. Briefly, in this approach, a set of sugar-based building blocks is created with each block preloaded with different protecting groups. The building blocks are ranked by reactivity of each protecting group. A computer program then determines exactly which building blocks must be added to the reaction so that the sequences of reactions from fastest to slowest produces the desired compound.

Kits.

In still another embodiment, this invention provides kits for practice of the method of this invention or for use of the materials produced by methods of this invention. In one embodiment, the kit comprises one or more reagents used to couple an organic molecule to a type IV element according to the methods of this invention. Such reagents include, but are not limited to reagents for cleaning and/or passivating a group IV element surface, reagents for derivatizing an organic molecule with an alcohol or a thiol, solvents for use in coupling the derivatized organic molecule to a group IV element surface, reagents for washing the derivatized surface, various redox-active molecules derivatized with an alcohol or a thiol, and the like.

In certain embodiments, the kits comprise a type IV element having an organic molecule coupled thereto as described herein. The type IV element can, in certain embodiments, comprise a molecular memory and in, certain embodiments, comprise a sensor.

In addition, the kits may include instructional materials containing directions (i.e., protocols) for the practice of the methods of this invention. Preferred instructional materials provide protocols utilizing the kit contents for coupling an organic molecule to a type IV element or for using type IV elements having coupled organic molecules as memory elements or as sensors. While the instructional materials typically comprise written or printed materials they are not limited to such. Any medium capable of storing such instructions and communicating them to an end user is contemplated by this invention. Such media include, but are not limited to electronic storage media (e.g., magnetic discs, tapes, cartridges, chips), optical media (e.g., CD ROM), and the like. Such media may include addresses to internet sites that provide such instructional materials.

EXAMPLES

The following examples are offered to illustrate, but not to limit the claimed invention.

Example 1

This example illustrates an approach to form SAMs of alcohol-terminated ferrocenes and porphyrins on Group IV element (e.g. Si) surfaces. In this instance, the molecules are attached to the Si surface via the formation of a Si—O bond. The new procedure has been successfully tested on both p and n-doped Si surfaces. The assemblies were stable under ambient conditions and could be exposed to repeated electrochemical oxidation and reduction cycling.

Experimental

A) Synthesis of Alcohol-terminated Ferrocenes and Porphyrins.

Figure 1B:
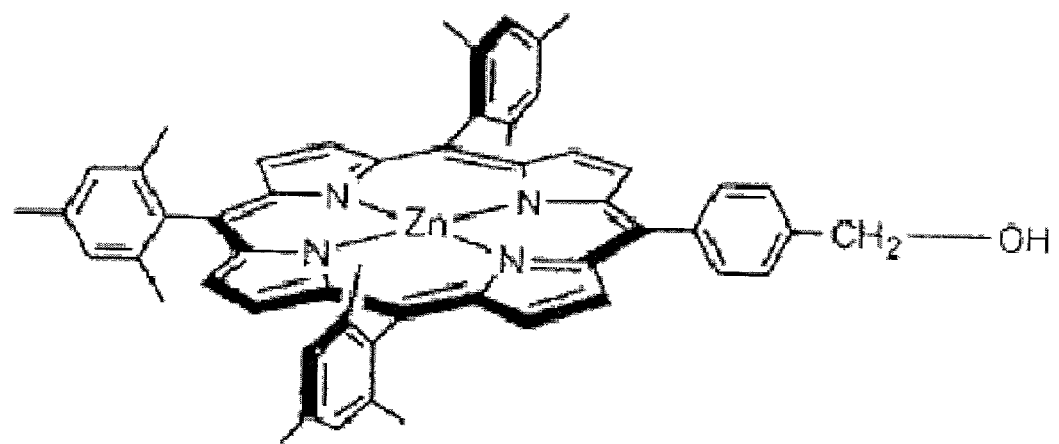

Alcohol-terminated ferrocenes and porphyrins were synthesized as described in U.S. Pat. Nos. 6,272,038, 6,212,093, and 6,208,553, and in PCT Publication WO 01/03126. The alcohol-terminated ferrocene and porphyrin illustrated in FIGS. 1A and 1B, respectively were used in the experiments described herein.

B) Formation of SAMs.

Figure 2:
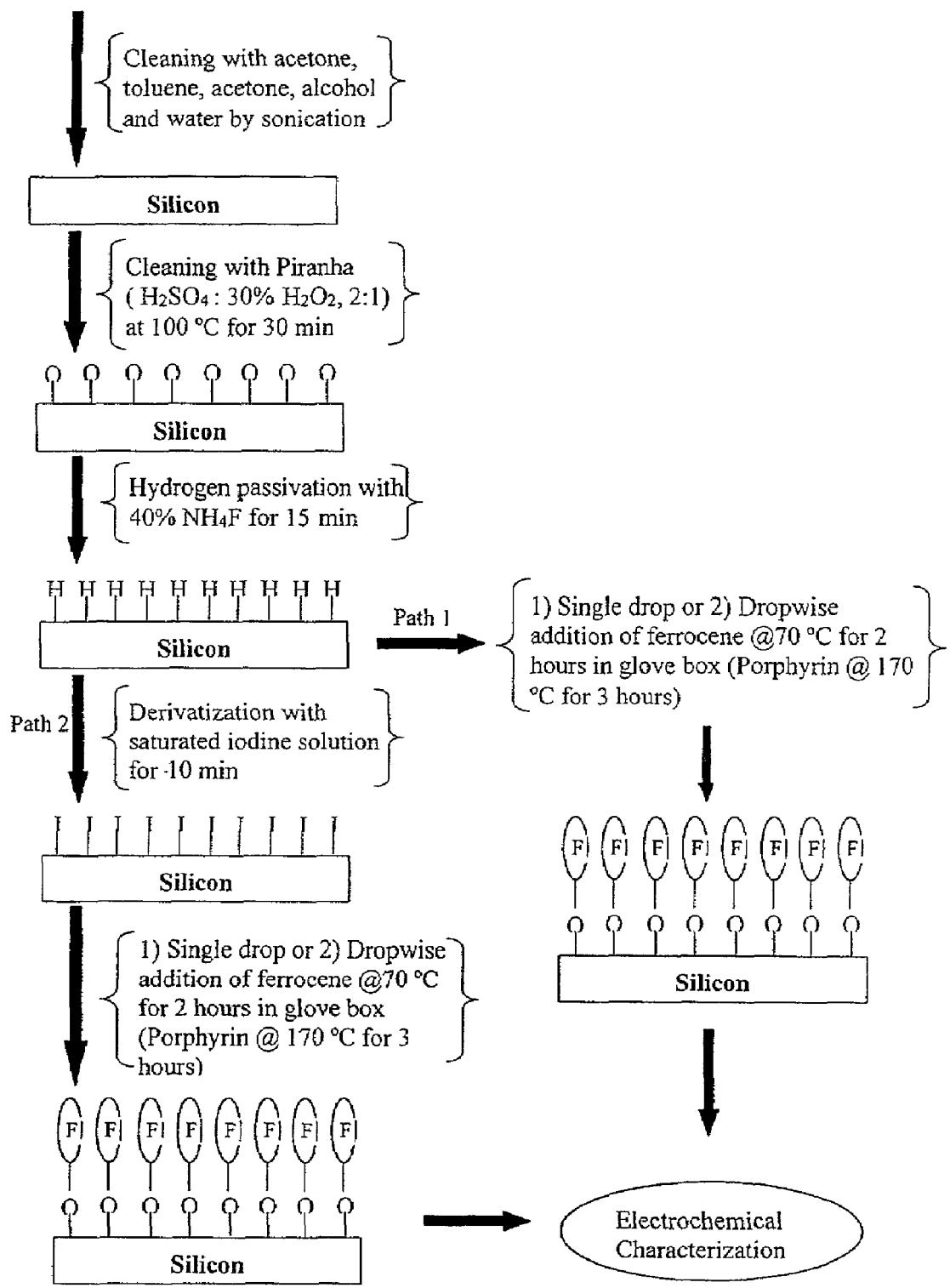
FIG. 2 illustrates a procedure for SAM formation.

FIG. 2 shows a schematic of one preferred embodiment of the assembly process. A Si(100) wafer (either n or p-doped) was cut in approx. 1 cm$^2$ pieces. Each piece of Si wafer was treated in the following manner: (1) Cleaned by sonication for 2 min. in each of the following solvents (in the order presented): acetone, toluene, acetone, ethanol and water. (2) Exposed to Piranha (sulfuric acid: 30% hydrogen peroxide, 2:1) at 100 ° C. for 30 min in a fume hood. (3) Rinsed copiously with deionized water. (4) Immersed in a 40% aqueous solution of ammonium fluoride for 15 min (to etch off the oxide layer form on the Si surface during Piranha cleaning) to obtain a prototypical hydrogen-passivated Si surface.

The ammonium fluoride solution was sparged with nitrogen for 15 min. to remove dissolved oxygen prior to use. (5) Residual solvent was removed by touching the edges of the piece to a piece of lint-free paper. (6) The individual pieces were sealed in a nitrogen-filled glass vial and transferred to an inert atmosphere glovebox for subsequent manipulation.

The iodide-derivatized Si surface was prepared from the prototypical hydrogen-passivated Si by exposing it to a saturated solution of I$_2$ in chloroform (water <0.005%) for 10 min., followed by rinsing with chloroform. The formation of ferrocene and porphyrin SAMs was dramatically accelerated by the dropwise addition of a saturated solution of the redox molecule onto the Si piece maintained at an elevated temperature. Dropwise addition was performed by releasing a 3 mL drop of the reaction solution every 20 min. over a time span of 2-3 hours. Each SAM-modified piece was allowed to cool and rinsed 3 times with benzonitrile to remove unbound material from the surface. After rinsing, the piece was removed from the glove box and sonicated twice for 20 sec in dry methylene chloride (water <0.005%).

Two types of controls were performed. (1) SAMs were formed as described above on the hydrogen-passivated Si surface in the absence of iodide treatment. (2) SAMs were prepared using both hydrogen-passivated and iodide-treated surfaces, but without dropwise addition of the reaction solution (i.e., a single drop was placed on the wafer for the same time period as the dropwise-treated surface).

C) Electrochemical Characterization.

SAM-modified Si surfaces were characterized electrochemically. A small area on each surface was defined by a poly(dimethyl siloxane) (PDMS) well (inner base diameter ranging between 1 and 3 mm, prepared in a homemade stainless steel mold). The defined area of the SAM was evaluated with cyclic voltammetry (scan rates between 1 and 100 V/s). Platinum wire and silver wire were used as auxiliary and reference electrodes, respectively; 1.0 M tetrabutyl ammonium hexafluorophosphate (TBAH) in methylene chloride or propylene carbonate was used as the electrolyte.

Results.

Cyclic voltammograms of the ferrocene and porphyrin SAMs are shown in FIGS. 3 and 4, respectively. In each figure, the left two panels (A & C) represent voltammograms obtained for SAMs formed on the control (hydrogen-passivated Si surface). The right two panels (B & D) represent voltammograms obtained for SAMs formed on the iodide-modified Si surface. In each case, the upper two panels (A & B) represent the control deposition method (single drop experiment), while the lower two panels (C & D) represent voltammograms obtained using the dropwise-addition deposition method. In each panel, the current is normalized to the maximum peak current to facilitate comparison between surfaces. All SAMs are stable when cycled electrochemically under ambient conditions, but the SAMs prepared from the iodide-modified Si surfaces are more robust to repeated electrochemical cycling than those prepared from the hydrogen-passivated surfaces. A linear increase in current with increasing scan rate confirms that the response is due to the oxidation of molecules attached to the surface. A casual inspection of the data reveals that the optimal electrochemical characteristics are found when the SAM is formed using dropwise-addition of the reagent solution at elevated temperatures at an iodide-modified Si surface (panel D in each figure). More specific information is given below.

A number of reports that demonstrate attachment of molecules to the Si surface via Si—H cleavage to form the Si—O bond (Path 1) (Buriak and Allen (1998) *J. Am. Chem. Soc.*, 120: 1339-1340; Coulter et al. (2000) *J. Vac. Sci. Technol. A* 18: 1965-1970; Bourkherroub and Wayner (1999) *J. Am. Chem. Soc.* 121: 11513-11515; Cleland et al. (1995) *Faraday Commun.*, 91: 4001-4003; Bateman et al. (1998) *Angew. Chem. Int. Ed.*, 37: 2683-2685). A chloride-derivatized surface has also been shown to react with alcohols to form Si—O bonds (Zhu et al. (1999) *Langmuir* 15: 8147-8154). However, this surface was obtained by exposing H-terminated silicon to chlorine gas (a highly toxic material). As demonstrated here, an iodide-modified surface is used to facilitate Si—O bond formation.

Figure 3A:
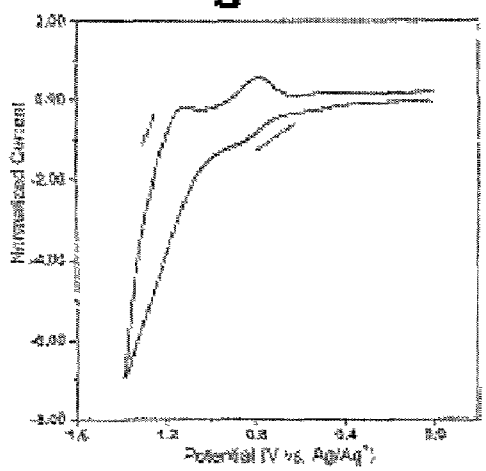
FIGS. 3A through 3D show cyclic voltammograms of SAM of Fc-$CH_2OH$ on p-doped silicon.
Figure 3B:
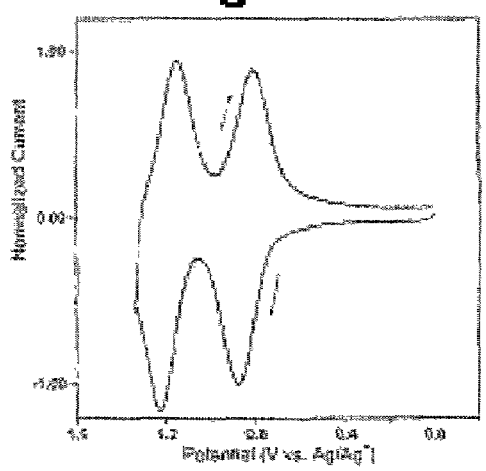
Figure 3C:
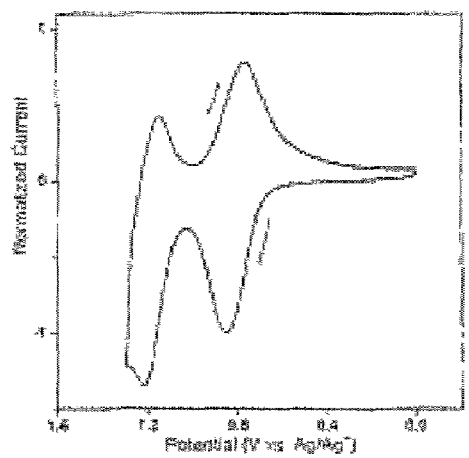
Figure 3D:
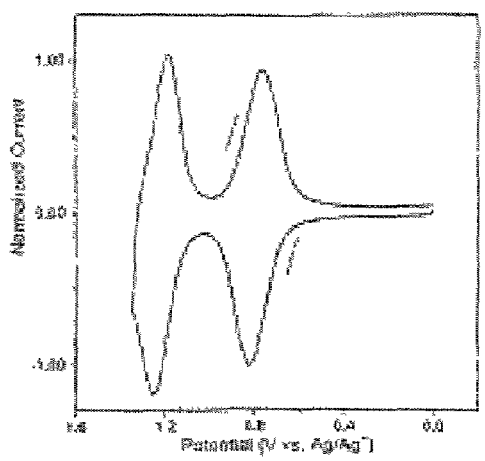
Figure 4A:
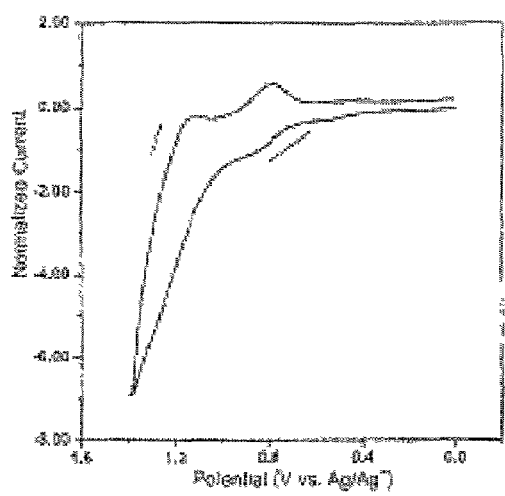
FIGS. 4A through 4D show cyclic voltammograms of SAM of Por-CH$_2$OH on p-doped silicon. 1% Por-CH$_2$OH in benzonitrile was placed on a terminated silicon surface heated on a hotplate at 170° C. for 3 hours in glove box.
Figure 4B:
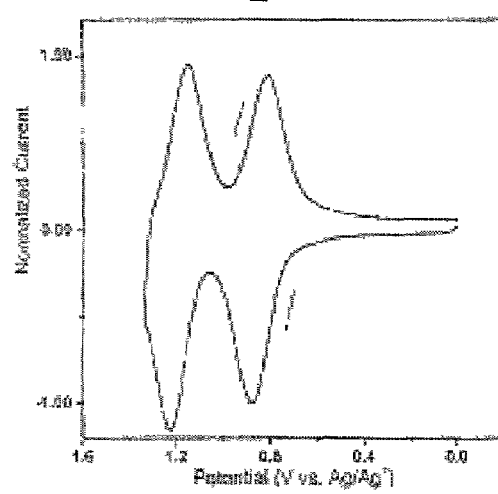
Figure 4C:
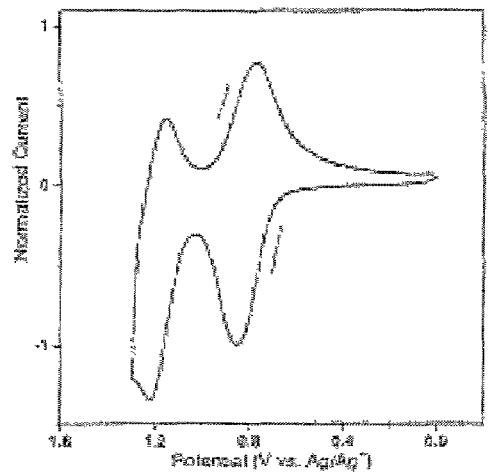
Figure 4D:
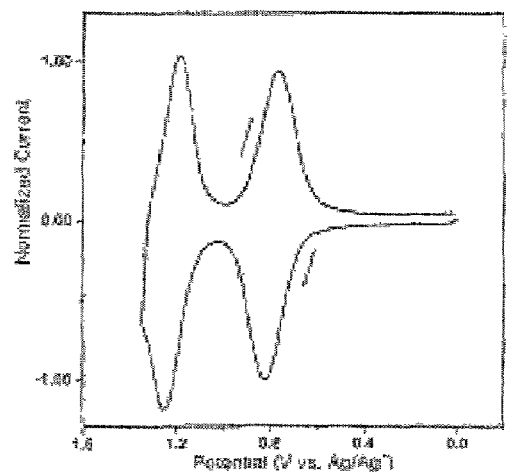

In the present case, the halogen is prepared in solution, thereby avoiding the use of hazardous gaseous materials. Iodine treatment of the hydride-terminated Si surface (FIG. 2, Path 2) results in the formation of a superior quality monolayer, as evidenced by the appearance of the voltammograms of the ferrocene monolayers (FIGS. 3B, 3D) compared to those formed from direct exposure of hydride-terminated silicon (FIGS. 3A, 3C). For the hydride-treated surface, the background oxidative current at higher anodic potentials reflects a poorly packed SAM, in that this current represents the oxidation of bulk Si. The improved SAM quality produced with iodine pre-treatment is also evident for the porphyrin SAM (the CV has sharp and symmetric peaks as shown in FIG. 4D, as compared to the untreated surface, FIG. 4C).

We have also examined the impact of the new SAM-formation protocol. The conventional approach utilizes a single drop of the reagent (e.g., a ferrocene-alcohol in chloroform) placed on the hydrogen-passivated Si wafer at room temperature. FIGS. 3A and 3B show CVs of SAMs obtained by this procedure. As shown, the background oxidative current at higher anodic potentials in these CVs reflects a poorly packed SAM, in that this current represents the oxidation of bulk Si. In contrast, ferrocene SAMs formed by periodic dropwise-addition of the ferrocene-alcohol solution on either the hydrogen-passivated or the iodide-treated Si surface at elevated temperature (70° C. for the ferrocene-alcohol and 170° C. for the porphyrin-alcohol) show much less background current (FIGS. 3C, 3D). This is indicative of a higher concentration of SAM-forming molecules during the reaction, leading to more uniform and tightly packed SAMs.

The conventional protocol was completely unsuccessful in the formation of porphyrin SAMs at room temperature, as indicated by a flat CV response (not shown). This indicates that the kinetics of SAM formation are much slower for the porphyrin-alcohol. FIG. 4B shows a CV of the porphyrin SAM formed by placing a single drop of the porphyrin-alcohol SAM-forming solution onto an iodine-treated Si surface maintained at 170° C. Close examination of the CV of this SAM (FIG. 4B) and the CV of the SAM obtained after dropwise-addition of the same solution (FIG. 4D) reveals the superior quality of the voltammetry of this system. In particular, the peak width (160 mV) and peak splitting (70 mV) are superior to those previously reported for ferrocene SAMs on Si (peak width, 205 mV and peak splitting, 97 mV) (Cleland et al. (1995) *Faraday Commun.*, 91: 4001-4003).

These above-described observations amplify the advantages of the methods of this invention. In particular, the halogen-treated silicon surface is a better platform for anchoring alcohols to silicon than the hydrogen-passivated surface. This procedure utilizes reagents that are more easily controlled and significantly less hazardous that those for the production of a Si—Cl surface. Finally, the controlled and periodic release of the reagent solution at elevated temperatures results in better packed and more stable monolayers than those formed simply by depositing a single aliquot of the reagent solution onto the group IV element surface.

Figure 5A:
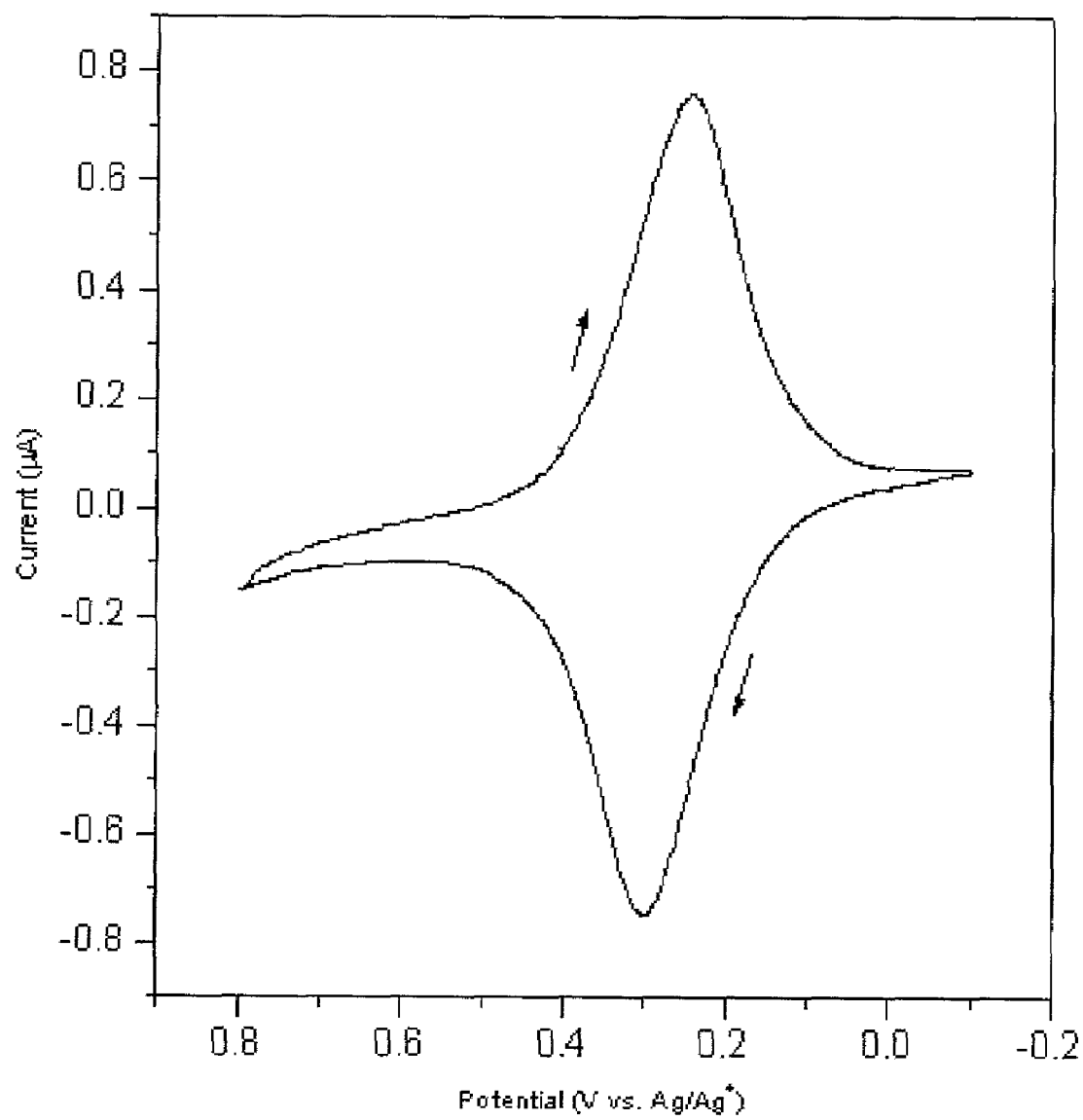
FIGS. 5A and 5B show cyclic voltammograms for ferrocene-phenyl-CH$_2$SH and porphyrin-phenyl-CH$_2$SH, respectively, on p-doped silicon. Voltammetry conditions were 1 V/s, 0.5 mm PDMS well, 1M TBAH in propylene carbonate (FIG. 5A) and 100 V/s 3 mm PDMS well, 1M TBAH in propylene carbonate (FIG. 5B).
Figure 5B:
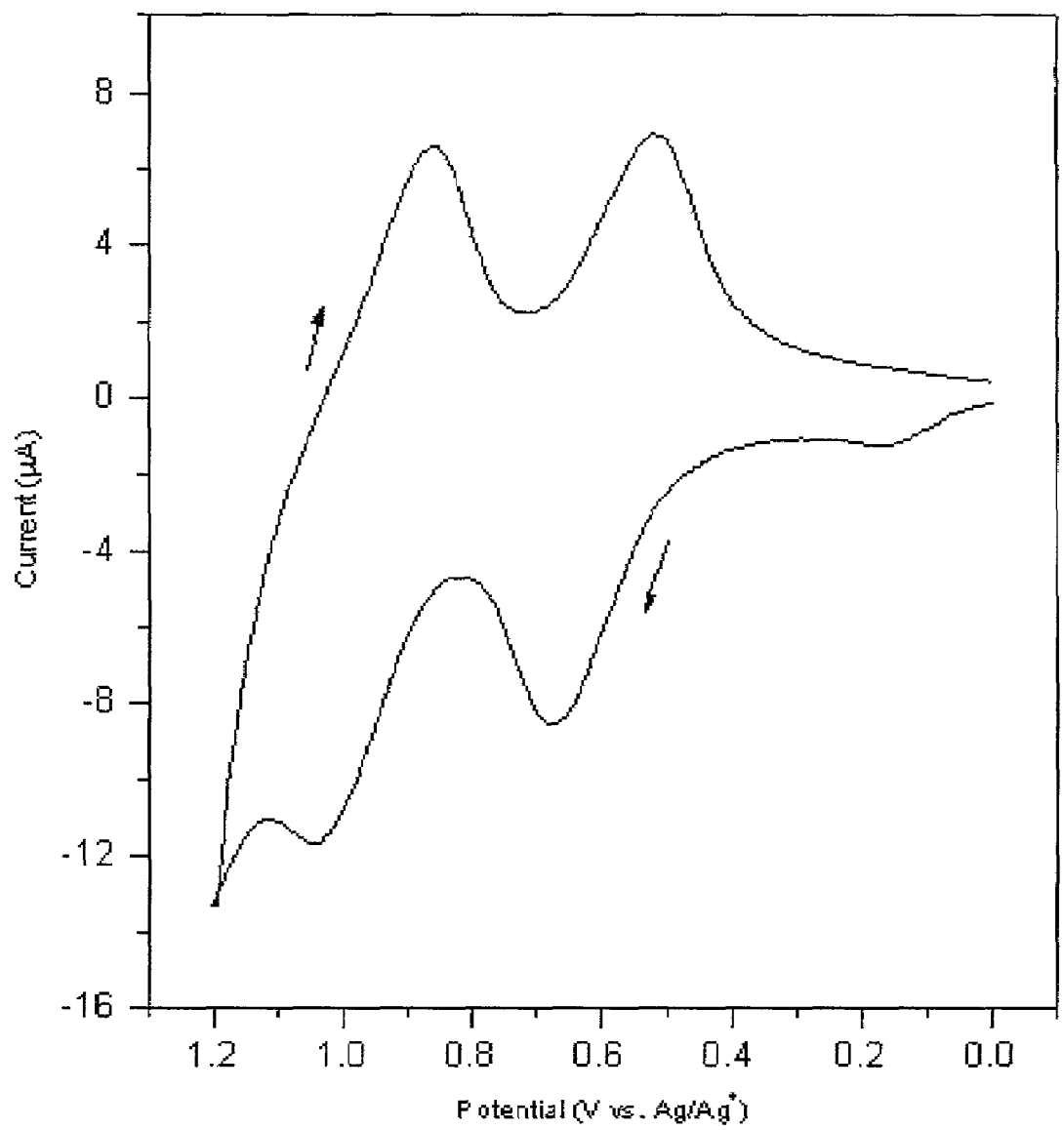

Similar experiments were performed using a ferrocene-phenyl-$CH_2SH$ and a porphyrin-phenyl-$CH_2SH$ on a p-doped silicon. Voltammograms of the ferrocene-phenyl-$CH_2SH$ and the porphyrin-phenyl-$CH_2SH$, respectively are show in FIGS. 5A and 5B, respectively.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety for all purposes.

What is claimed is:

1. A method of coupling a redox-active molecule to a surface comprising a Group IV element, said method comprising:

halogenating said group IV element surface;

providing a solution comprising said redox-active molecule wherein said redox-active molecule is selected from the group consisting of a porphyrin, an expanded porphyrin, a contracted porphyrin, a ferrocene, a linear porphyrin polymer, a porphyrinic sandwich coordination complex, and a porphyrin array, said redox-active molecule is alcohol terminated, and said alcohol-terminated redox-active molecule is in a solvent; and contacting said solution with said surface under conditions where said solvent is removed from said surface whereby said redox-active molecule is coupled to said surface through an E-O bond where E is said group IV element.

2. The method of claim 1, wherein said Group IV element is silicon or germanium.

3. The method of claim 2, wherein said surface is a doped silicon surface.

4. The method of claim 3, wherein said surface is an n-doped silicon surface.

5. The method of claim 3, wherein said surface is a p-doped silicon surface.

6. The method of claim 2, wherein said surface is a hydrogen passivated surface.

7. The method of claim 2, wherein said contacting is in the presence of a base.

8. The method of claim 2, wherein said contacting is in the presence of a base selected from the group consisting of 2,4,6-collidine, 2,6-lutidine, 2,6-di-tert-butylpyridine, 4-dimethylaminopyridine, trimethylamine, triethylamine, tributylamine, N,N-diisopropylethylamine, 1,8-bis(dimethylamino)naphthalene, 1,5-diazabicyclo[4.3.0]non-5-ene, 1,8-diazabicyclo[5.4.0]undec-7-ene, $Na_2CO_3$, and $NH_3$.

9. The method of claim 1, wherein said redox-active molecule comprises a porphyrinic macrocycle substituted at a β-position or at a meso-position.

10. The method of claim 1, wherein said redox-active molecule comprises a porphyrinic macrocycle containing at least two porphyrins of equal energies held apart from each other at a spacing less than about 50 Å such that said molecule has an odd hole oxidation state permitting the hole to hop between said two porphyrins and wherein said odd hole oxidation state is different from and distinguishable from another oxidation state of said porphyrinic macrocycle.

11. The method of claim 2, wherein said contacting comprises selectively applying said solution to certain regions of said group IV element surface and not to other regions.

12. The method of claim 11, wherein said contacting comprises:
placing a masking material on said surface in regions where said organic molecule is not to be attached;
contacting said solution with the surface; and removing the masking material to provide regions of the surface without said organic molecule.

13. The method of claim 2, wherein said contacting comprises coating said surface with said solution.

14. The method of claim 2, wherein the alcohol terminated organic molecule is terminated with an alcohol selected from the group consisting of a primary alcohol, a secondary alcohol, a tertiary alcohol, a benzyl alcohol, and an aryl alcohol.

15. The method of claim 2, wherein said solvent is a solvent with a boiling point greater than 130° C.

16. The method of claim 15, wherein said solvent is selected from the group consisting of mesitylene, durene, o-dichlorobenzene, 1,2,4,-trichlorobenzene, 1-chloronaphthalene, 2-chloronaphthalene, N,N-dimethylformamide, N,N-dimethylacetamide, N,N-dimethylpropionamide, benzonitrile, and anisole.

17. The method of 15, wherein said surface is heated and said solution is applied to said surface whereby said solvent boils off of said surface.

18. The method of claim 17, wherein said surface is heated to a temperature of at least about 70° C.

19. The method of claim 2, wherein said solvent is applied to said surface and said surface is subjected to a vacuum that boils said solvent off of said surface.

20. The method of claim 2, wherein said halogenating comprises contacting said surface with a halogen selected from the group consisting of iodine, bromine, fluorine, and chlorine.

21. The method of claim 20, wherein said halogenating comprises contacting said surface with iodine.

22. The method of claim 20, wherein said halogenating comprises contacting said surface with a reagent selected from the group consisting of N-bromosuccinimide, N-chlorosuccinimide, N-iodosuccinimide, ICl, $SO_2Cl_2$, $BrCCl_3$, $PCl_5$, $CBr_4$, $Br_2$+HgO, $MoCl_5$, $CF_3OF$, $AgSbF_6$, PhSe(O)Cl, $AlCl_3$, $AlBr_3$, and $Cl_2O$.

23. The method of claim 1, wherein said halogenating comprises contacting said surface with a free radical initiator selected from the group consisting of UV light, benzoyl peroxide, and AIBN (2,2'-azobisisobutyronitrile).

* * * * *